(12) United States Patent
Jeong et al.

(10) Patent No.: US 12,063,814 B2
(45) Date of Patent: Aug. 13, 2024

(54) DISPLAY PANEL AND DISPLAY APPARATUS INCLUDING THE SAME

(71) Applicant: Samsung Display Co., Ltd., Yongin-si (KR)

(72) Inventors: Junki Jeong, Yongin-si (KR); Seonyoung Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 466 days.

(21) Appl. No.: 17/504,379

(22) Filed: Oct. 18, 2021

(65) Prior Publication Data

US 2022/0285468 A1 Sep. 8, 2022

(30) Foreign Application Priority Data

Mar. 2, 2021 (KR) .................. 10-2021-0027563

(51) Int. Cl.
*H10K 59/12* (2023.01)
*H10K 59/121* (2023.01)
*H10K 59/126* (2023.01)
*H10K 59/131* (2023.01)

(52) U.S. Cl.
CPC ..... *H10K 59/1213* (2023.02); *H10K 59/1216* (2023.02); *H10K 59/126* (2023.02); *H10K 59/131* (2023.02)

(58) Field of Classification Search
CPC ............. H10K 59/1213; H10K 59/131; H10K 59/126; H10K 59/1216
USPC ........................................................ 257/40
See application file for complete search history.

(56) References Cited

U.S. PATENT DOCUMENTS

| 10,418,434 B2 | 9/2019 | Kim et al. |
| 2019/0214440 A1* | 7/2019 | Lee .................. G06F 3/044 |
| 2020/0064702 A1 | 2/2020 | Yeh et al. |

FOREIGN PATENT DOCUMENTS

| CN | 110047897 | 7/2019 | |
| CN | 111063719 | 4/2020 | |
| CN | 111180494 | 5/2020 | |
| KR | 10-2017-0114026 | 10/2017 | |
| KR | 20220120804 A * | 8/2022 | ........... H10K 59/131 |
| WO | WO-2020085592 A * | 4/2020 | ........ H10K 59/1213 |
| WO | WO-2021189482 A * | 12/2021 | ........... H10K 59/123 |

* cited by examiner

*Primary Examiner* — Phuc T Dang
(74) *Attorney, Agent, or Firm* — KILE PARK REED & HOUTTEMAN PLLC

(57) ABSTRACT

A display panel includes: a substrate having a main display area, an auxiliary display area, and a peripheral area, the auxiliary display area having a circuit area and a component area; main display elements arranged in the main display area and main pixel circuits respectively connected to the main display elements; first display elements arranged in the component area; second display elements arranged in the circuit area; and auxiliary pixel circuits arranged in the circuit area, wherein the circuit area is arranged between the main display area and the component area, the auxiliary pixel circuits include: first pixel circuits connected to the first display elements, respectively; and second pixel circuits connected to the second display elements, respectively, and at least some of the second display elements overlap the first pixel circuits.

20 Claims, 18 Drawing Sheets

DISPLAY PANEL AND DISPLAY APPARATUS INCLUDING THE SAME

CROSS-REFERENCE TO RELATED APPLICATIONS

This application claims priority from and the benefit of Korean Patent Application No. 10-2021-0027563, filed on Mar. 2, 2021, which is hereby incorporated by reference for all purposes as if fully set forth herein.

BACKGROUND

Field

Embodiments of the invention relate to a display panel and a display apparatus including the display panel, and more specifically, to a display panel having an extended display area so that an image may be displayed even in an area in which a component that is an electronic element is arranged, and a display apparatus including the display panel.

Discussion of the Background

Recently, the usage of display apparatuses has diversified. In addition, as display apparatuses have become thinner and lighter, the range of use thereof has expanded.

As display apparatuses are utilized in various ways, there may be various ways to design display apparatuses in various shapes, and the number of functions combined with or linked to display apparatuses has increased.

The above information disclosed in this Background section is only for understanding of the background of the inventive concepts, and, therefore, it may contain information that does not constitute prior art.

SUMMARY

Devices constructed according to embodiments of the invention are capable of displaying an image in both an image display region and in a region in which components and/or circuits are disposed.

One or more embodiments provide a display panel having an extended area so that an image may be displayed even in an area in which a component that is an electronic element is arranged, and a display apparatus including the display panel. However, these objectives are examples and do not limit the scope of the disclosure.

Additional features of the inventive concepts will be set forth in the description which follows, and in part will be apparent from the description, or may be learned by practice of the inventive concepts.

According to an embodiment, a display panel includes a substrate including a main display area, an auxiliary display area, and a peripheral area, the auxiliary display area including a circuit area and a component area, main display elements arranged in the main display area and main pixel circuits respectively connected to the main display elements, first display elements arranged in the component area, second display elements arranged in the circuit area, and auxiliary pixel circuits arranged in the circuit area, wherein the circuit area is arranged between the main display area and the component area, the auxiliary pixel circuits includes first pixel circuits connected to the first display elements, respectively, and second pixel circuits connected to the second display elements, respectively, and at least some of the second display elements overlap the first pixel circuits.

The display panel may further include a pad unit in the peripheral area, and the circuit area may include a first circuit area and a second circuit area which are spaced apart from each other with the component area therebetween, and the first circuit area may be arranged farther from the pad unit than the component area, and the second circuit area may be arranged closer to the pad unit than the component area.

An area occupied by one of the auxiliary pixel circuits may be greater than an area occupied by one of the main pixel circuits.

The main pixel circuit may include a semiconductor layer including a first channel area, and a first transistor having a first gate electrode, the auxiliary pixel circuit may include a semiconductor layer including a second channel area, and a second transistor having a second gate electrode, the first transistor and the second transistor may be driving thin-film transistors, and a width of the second channel area may be greater than a width of the first channel area.

A length of the second channel area may be less than a length of the first channel area.

The main pixel circuit may include a main capacitor overlapping the first transistor, the auxiliary pixel circuit may include an auxiliary capacitor overlapping the second transistor, and a capacitance of the auxiliary capacitor may be greater than a capacitance of the main capacitor.

The second pixel circuits may be arranged between the main pixel circuits and the first pixel circuits.

A number of first pixel circuits may be greater than a number of second pixel circuits.

The display panel may further include a first data line and a second data line which are spaced apart from each other with the auxiliary display area therebetween, and the first data line and the second data line may be connected to each other using a data connection line.

The data connection line may detour around the auxiliary display area and be arranged in the main display area.

At least a portion of the data connection line may be arranged in the peripheral area.

The display panel may further include a shielding line overlapping the data connection line.

A number of first display elements per unit area and a number of second display elements per unit area may be less than a number of main display elements per unit area.

According to another embodiment, a display apparatus includes a display panel including a main display area, an auxiliary display area, and a peripheral area, the auxiliary display area having a circuit area and a component area therein, and a component arranged to correspond to the component area at a lower portion of the display panel, wherein the display panel includes a substrate, main display elements arranged in the main display area and main pixel circuits connected to the main display elements, auxiliary display elements including first display elements arranged in the component area and second display elements arranged in the circuit area, and auxiliary pixel circuits connected to the auxiliary display elements, the auxiliary pixel circuits may include first pixel circuits connected to the first display elements, respectively, and second pixel circuits connected to the second display elements, respectively, the circuit area may be arranged between the main display area and the component area, and at least some of the second display elements may overlap the first pixel circuits.

The display panel may further include a pad unit in the peripheral area, and the circuit area may include a first circuit area and a second circuit area which are spaced apart from each other with the component area therebetween, and the first circuit area may be arranged farther from the pad unit than the component area, and the second circuit area may be arranged closer to the pad unit than the component area.

The main pixel circuit may include a semiconductor layer including a first channel area, and a first transistor having a first gate electrode, the auxiliary pixel circuit may include a semiconductor layer including a second channel area, and a second transistor having a second gate electrode, the first transistor and the second transistor may be driving thin-film transistors, and a width of the second channel area may be greater than a width of the first channel area.

A length of the second channel area may be less than a length of the first channel area.

The main pixel circuit may include a main capacitor overlapping the first transistor, the auxiliary pixel circuit may include an auxiliary capacitor overlapping the second transistor, and a capacitance of the auxiliary capacitor may be greater than a capacitance of the main capacitor.

The display apparatus may further include a shielding line overlapping a data connection line.

A number of first display elements per unit area and a number of second display elements per unit area may be less than a number of main display elements per unit area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
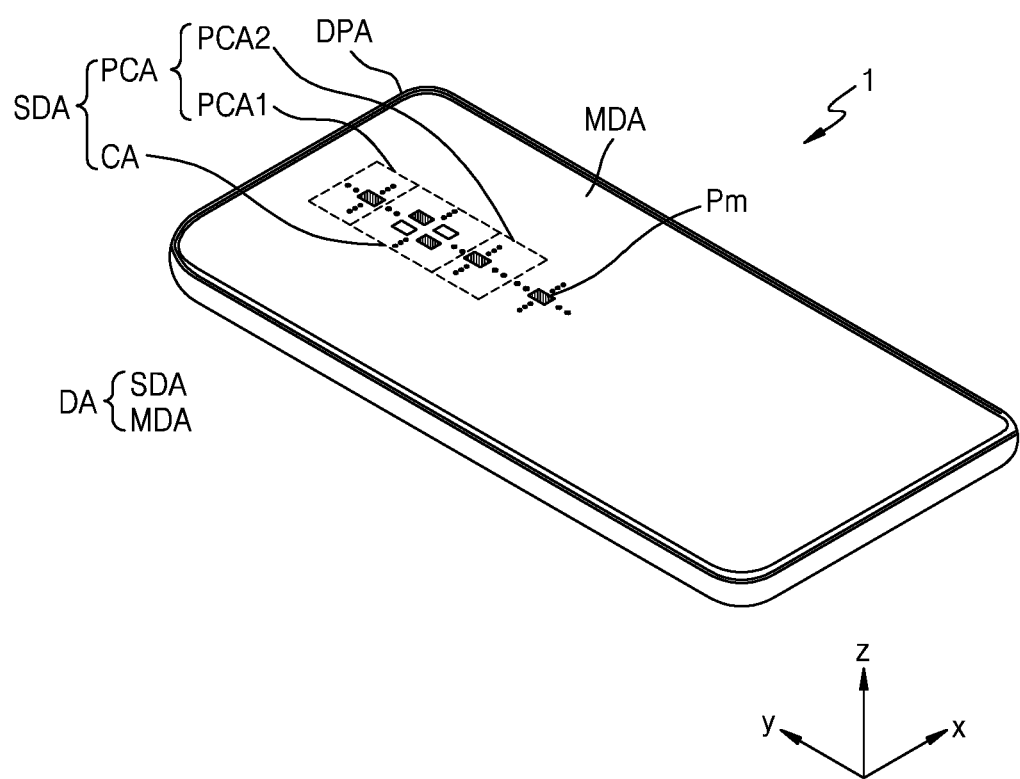
FIG. 1 is a perspective view schematically illustrating a display apparatus according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another (i.e., substantially perpendicular to one another). For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic perspective view of a display apparatus 1 according to an embodiment that is constructed according to principles of the invention.

Referring to FIG. 1, the display apparatus 1 includes a display area DA and a peripheral area DPA outside the display area DA. The display area DA includes an auxiliary display area SDA and a main display area MDA at least partially surrounding the auxiliary display area SDA. In other words, the auxiliary display area SDA and the main display area MDA may display an image individually or together. The peripheral area DPA may be a kind of a non-display area in which no display elements are arranged. The display area DA may be entirely surrounded by the peripheral area DPA.

In FIG. 1, the main display area MDA has one auxiliary display area SDA arranged therein. In another embodiment, the display apparatus 1 may include two or more auxiliary display areas SDA, and shapes and sizes of the plurality of auxiliary display areas SDA may be different from each other. In a view in a direction substantially perpendicular to an upper surface of the display apparatus 1, the auxiliary display area SDA may have various shapes such as a circular shape, an elliptical shape, a polygonal shape such as a quadrilateral or the like, a star shape, a diamond shape, or the like. In addition, in FIG. 1, in a view in the direction substantially perpendicular to the upper surface of the display apparatus 1, the auxiliary display area SDA is arranged at an upper center (in a +y direction) of the main display area MDA, but the auxiliary display area SDA may be arranged at one side, for example, at an upper right side or an upper left side, of the quadrilateral main display area MDA.

The auxiliary display area SDA includes a circuit area PCA and a component area CA. The circuit area PCA may be arranged around the component area CA, and may be arranged between the main display area MDA and the component area CA. The circuit area PCA may have a rectangle shape of which one side is shared with the component area CA. In another example, the circuit area PCA may have a shape in which two rectangles are spaced apart from each other with respect to the component area CA, and may be arranged at an upper side (in a y-axis direction) and a lower side (in a −y-axis direction) of the component area CA. In FIG. 1, in a view in the direction substantially perpendicular to the upper surface of the display apparatus 1, the circuit area PCA is arranged at the upper side (in the +y-axis direction) and the lower side (in the −y-axis direction) of the component area CA having a substantially quadrilateral shape, but the circuit area PCA may be arranged at one side, for example, at a left side or right side (in the x-axis direction), of the quadrilateral component area CA.

Figure 2:
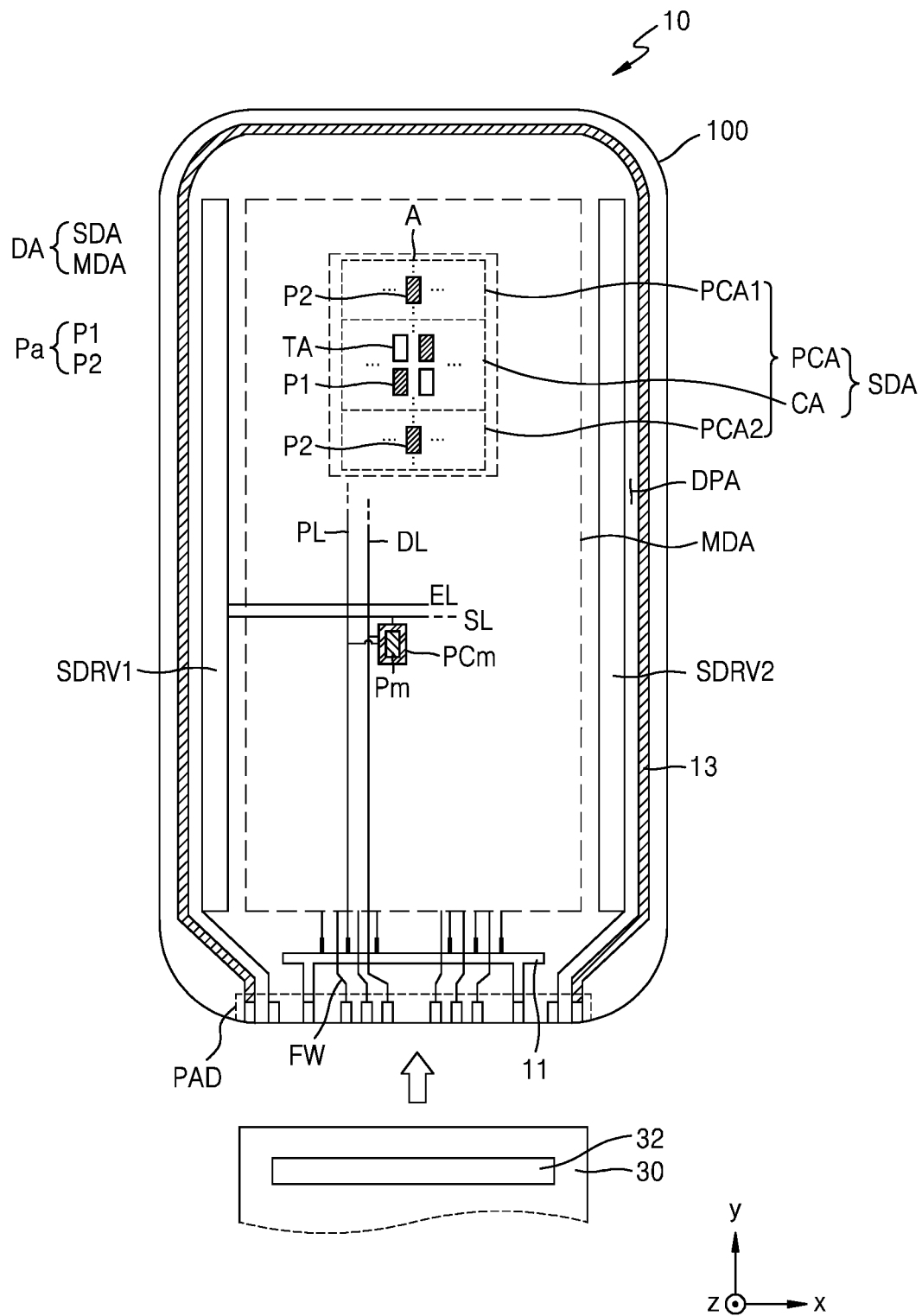
FIG. 2 is a schematic plan view of a display panel that may be included in the display apparatus of FIG. 1.
Figure 3:
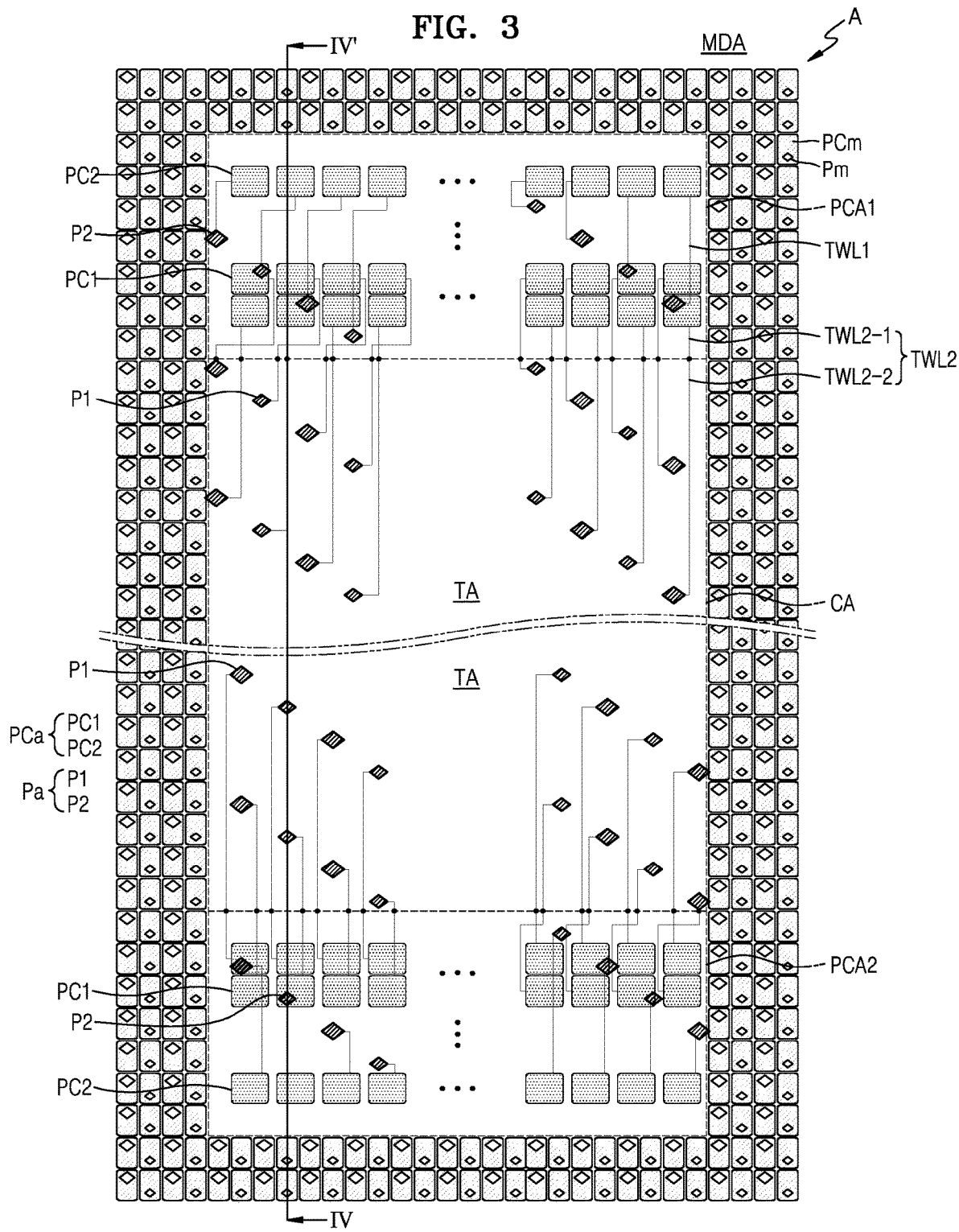
FIG. 3 is an enlarged plan view of a region of FIG. 2.

FIG. 2 is a schematic plan view of a display panel 10 that may be included in the display apparatus 1 of FIG. 1. FIG. 3 is a plan view of enlarged region A in FIG. 2.

Referring to FIGS. 2 and 3, various elements included in the display panel 10 are arranged on a substrate 100. The substrate 100 includes the display area DA and the peripheral area DPA surrounding the display area DA. The display area DA includes the main display area MDA in which a main image is displayed, and the auxiliary display area SDA in which the circuit area PCA and the component area CA are arranged and an auxiliary image is displayed. The auxiliary image may form one full image together with the main image and may be independent from the main image.

The main display area MDA may have a plurality of main sub-pixels Pm arranged therein. Each of the main sub-pixels Pm may be implemented as a display element, such as an organic light-emitting diode. A main pixel circuit PCm electrically connected to each of the plurality of main sub-pixels Pm and configured to drive the main sub-pixel Pm may be arranged in the main display area MDA, and the main pixel circuit PCm may overlap the main sub-pixel Pm.

For example, each of the main sub-pixels Pm may emit red, green, blue, or white light. The main sub-pixels Pm may be arranged in a pentile structure. For example, among vertices of a virtual quadrilateral having a center thereof at a center point of a sub-pixel of green light, a sub-pixel of red light may be arranged at first and third vertices which face each other, and a sub-pixel of blue light may be arranged at second and fourth vertices, which are remaining vertices. The sub-pixel of the green light may be smaller in size than each of the remaining sub-pixels. This pixel arrangement structure is referred to as a pentile matrix structure, or a pentile structure, and by applying a rendering drive in which adjacent pixels are shared to express colors, a high resolution may be implemented with a small number of pixels.

In FIG. 3, the main sub-pixels Pm are arranged in a pentile matrix structure, but the embodiment is not limited thereto. For example, the main sub-pixels Pm may be arranged in various shapes, such as a stripe structure, a mosaic array structure, a delta array structure, or the like.

The main display area MDA may be covered with a sealing member and protected from ambient air, moisture, or the like.

The auxiliary display area SDA may have a plurality of auxiliary sub-pixels Pa arranged therein. Each of the auxiliary sub-pixels Pa may be implemented as a display element, such as an organic light-emitting diode (OLED). For example, each of the auxiliary sub-pixels Pa may emit red, green, blue, or white light.

The auxiliary sub-pixels Pa arranged in the auxiliary display area SDA may be arranged in various shapes. Some of the auxiliary sub-pixels Pa may collectively form a pixel group and may be arranged in various shapes, such as a stripe structure, a mosaic array structure, a delta array structure, or the like. An array structure of the auxiliary sub-pixels Pa may be a same as that of the main sub-pixels Pm. A number per unit area of the auxiliary sub-pixels Pa arranged in the auxiliary display area SDA may be less than a number per unit area of the main sub-pixels Pm arranged in the main display area MDA. For example, the number of auxiliary sub-pixels Pa and the number of main sub-pixels Pm arranged per a same area may be provided in a ratio of 1:2, 1:4, 1:8, or 1:9. In other words, a resolution of the auxiliary display area SDA may be 1/2, 1/4, 1/8, or 1/9 that of the main display area MDA. The auxiliary sub-pixels Pa may include a first sub-pixel P1 in the component area CA and a second sub-pixel P2 in the circuit area PCA.

The auxiliary sub-pixels Pa may have a same array as the main sub-pixels Pm to minimize visual disparity between the main display area MDA and the auxiliary display area SDA. By being arranged in a regular manner, at least some of the auxiliary sub-pixels Pa may overlap an auxiliary pixel circuit PCa. For example, at least some of the second sub-pixels P2 may overlap some of first pixel circuits PC1.

The auxiliary sub-pixel Pa may be larger in size from the main sub-pixel Pm to emit light of a substantially same luminance as the main sub-pixels Pm.

The auxiliary display area SDA may be covered with a sealing member and protected from ambient air, moisture, or the like. The auxiliary display area SDA may be at one side of the main display area MDA as described above, or may be arranged inside the display area DA and surrounded by the main display area MDA. The auxiliary display area SDA may include a first circuit area PCA1, a second circuit area PCA2, and the component area CA.

The component area CA may include a plurality of first sub-pixels P1 arranged therein. The plurality of first sub-pixels P1 may emit light and provide an image. The component area CA may include a transmission area TA. The transmission area TA may be arranged to surround the plurality of first sub-pixels P1. In some embodiments, the transmission area TA may be arranged in a grid shape with the plurality of first sub-pixels P1.

An image displayed in the component area CA may have a lower resolution than an image displayed in the main display area MDA. In other words, the component area CA includes the transmission area TA through which light or sound may pass, and when no sub-pixels are arranged in the transmission area TA, the number of first sub-pixels P1 that may be arranged per unit area may be less than the number of main sub-pixels Pm arranged per unit area in the main display area MDA.

Because the component area CA includes the transmission area TA, a resolution of the component area CA may be less than that of the main display area MDA. For example, the resolution of the component area CA may be about 1/2, 3/8, 1/3, 1/4, 2/9, 1/8, 1/9, or 1/16 that of the main display area MDA. For example, the resolution of the main display area MDA may be about 500 ppi, and the resolution of the component area CA may be about 250 ppi or about 180 ppi.

The circuit area PCA may include a plurality of second sub-pixels P2 arranged therein. The plurality of second sub-pixels P2 may emit light and provide an image. An image displayed in the circuit area PCA may have a lower resolution than the image displayed in the main display area MDA. For example, the resolution of the circuit area PCA may be about 1/2, 3/8, 1/3, 1/4, 2/9, 1/8, 1/9, or 1/16 that of the main display area MDA. For example, the resolution of the main display area MDA may be about 500 ppi, and the resolution of the circuit area PCA may be about 250 ppi or about 180 ppi. The resolution of the circuit area PCA may be a same as that of the component area CA in order to eliminate visual disparity between images.

An area of each of the first circuit area PCA1 and the second circuit area PCA2 may be less than that of the component area CA. For example, the component area CA may have a square shape having a horizontal length of 3 mm and a vertical length of 3 mm, and each of the first circuit area PCA1 and the second circuit area PCA2 may have a rectangle shape having a horizontal length of 3 mm and a vertical length of 0.5 mm.

The area of the component area CA may be greater than that of the circuit area PCA, and thus, the number of first sub-pixels P1 may be greater than the number of second sub-pixels P2. Thus, the number of first pixel circuits PC1 configured to drive the first sub-pixel P1 may be greater than the number of second pixel circuits PC2 configured to drive the second sub-pixel P2. For example, among the auxiliary pixel circuits PCa arranged in the first circuit area PCA1, seven rows of auxiliary pixel circuits PCa arranged closer to the component area CA may be the first pixel circuit PC1, and three rows of auxiliary pixel circuits PCa arranged at an upper side in the +y direction may be the second pixel circuit PC2. In addition, among the auxiliary pixel circuits PCa arranged in the second circuit area PCA2, seven rows of auxiliary pixel circuits PCa arranged closer to the component area CA may be the first pixel circuit PC1, and three rows of auxiliary pixel circuits PCa arranged at a lower side in the −y direction may be the second pixel circuit PC2.

An area occupied by the auxiliary pixel circuit PCa may be greater than an area occupied by the main pixel circuit PCm. For example, the area occupied by the auxiliary pixel circuit PCa may be about twice the area occupied by the main pixel circuit PCm.

The first sub-pixels P1 may be arranged to be spaced apart from the first pixel circuit PC1 arranged in the circuit area PCA, and may be arranged in the component area CA. The first sub-pixel P1 may be connected to the first pixel circuit PC1 via a second connection line TWL2.

The second connection line TWL2 may include a (2-1)st connection line TWL2-1 and a (2-2)nd connection line TWL2-2. The (2-1)st connection line TWL2-1 may be arranged in the circuit area PCA, and the (2-2)nd connection line TWL2-2 may be arranged in the transmission area TA of the component area CA. The (2-1)st connection line TWL2-1 may be arranged on a same layer as the (2-2)nd connection line TWL2-2, but the (2-1)st connection line TWL2-1 and the (2-2)nd connection line TWL2-2 may include different materials from each other. An end of the (2-2)nd connection line TWL2-2 may cover an end of the (2-1)st connection line TWL2-1. The (2-1)st connection line TWL2-1 may include a conductive material, such as molybdenum (Mo), aluminum (Al), copper (Cu), titanium (Ti), or the like, and may include a multilayer or a single layer including the materials described above. As will be described below with reference to FIG. 7B, the second connection line TWL2 may further include a (2-3)rd connection line TWL2-3 arranged on a different layer from the (2-1)st connection line TWL2-1 and the (2-2)nd connection line TWL2-2. In some embodiments, the (2-1)st connection line TWL2-1 and a portion of a data line may be arranged on a same layer, and may include a same material. The (2-2)nd connection line TWL2-2 may include a transparent conductive material. For example, the (2-2)nd connection line TWL2-2 may include a transparent conducting oxide (TCO). The (2-2)nd connection line TWL2-2 may include a conducting oxide, such as indium tin oxide (ITO), indium zinc oxide (IZO), zinc oxide (ZnO), indium oxide ($In_2O_3$), indium gallium oxide (IGO), or aluminum zinc oxide (AZO).

The (2-1)st connection line TWL2-1 may have a higher conductivity than the (2-2)nd connection line TWL2-2. Because the (2-1)st connection line TWL2-1 is in the circuit area PCA, a light transmittance may not be ensured, and thus, a material having a lower light transmittance than the (2-2)nd connection line TWL2-2 but having a higher conductivity than the (2-2)nd connection line TWL2-2 may be used. Thus, a resistance value of a connection line TWL2 may be minimized.

Some of the second sub-pixels P2 may be spaced apart from the second pixel circuits PC2 arranged in the circuit area PCA, and may be electrically connected to the second pixel circuit PC2 through a first connection line TWL1. The remaining second sub-pixels P2 may be arranged to overlap the first pixel circuit PC1 or the second pixel circuit PC2, and may be electrically connected to the second pixel circuit PC2.

The first connection line TWL1 may be arranged in the circuit area PCA and electrically connect the second sub-pixel P2 and the second pixel circuit PC2 to each other. The first connection line TWL1 may include a conductive material, such as Mo, Al, Cu, Ti, or the like, and may include a multilayer or a single layer including the materials described above. Because the first connection line TWL1 is arranged in the circuit area PCA, a light transmittance may not be secured, and thus, a material having a lower light transmittance than the (2-2)nd connection line TWL2-2 but having higher conductivity than the (2-2)nd connection line TWL2-2 may be used. Thus, a resistance value of the first connection line TWL1 may be minimized.

The first pixel circuits PC1 may be arranged in the circuit area PCA, but may be close to the component area CA. The second pixel circuits PC2 may be arranged in the circuit area PCA, but may be spaced apart from the component area CA. In other words, in a view in a direction substantially perpendicular to an upper surface of region A, the first pixel circuits PC1 may be arranged between the first sub-pixels P1 and the second pixel circuits PC2 with respect to the y direction.

Each of the main and auxiliary pixel circuits PCm and PCa configured to drive the main and auxiliary sub-pixels Pm and Pa, respectively, may be electrically connected to outer circuits arranged in the peripheral area DPA. A first scan driving circuit SDRV1, a second scan driving circuit SDRV2, a pad unit PAD, a driving voltage supply line 11, and a common voltage supply line 13 may be arranged in the peripheral area DPA.

The first scan driving circuit SDRV1 may transmit a scan signal to each of the main and auxiliary pixel circuits PCm and PCa through a scan line SL. The first scan driving circuit SDRV1 may transmit an emission control signal to each of the main and auxiliary pixel circuits PCm and PCa via an emission control line EL. The second scan driving circuit SDRV2 may be at an opposite side of the first scan driving circuit SDRV1 with respect to the main display area MDA, and may be substantially parallel to the first scan driving circuit SDRV1. Some of the main pixel circuits PCm of the main display area MDA may be electrically connected to the first scan driving circuit SDRV1, and other ones may be electrically connected to the second scan driving circuit SDRV2.

The pad unit PAD may be arranged at one side of the substrate 100. The pad unit PAD is exposed by not being covered with an insulating layer, and connected to a printed circuit board 30. The printed circuit board 30 may include a display driving unit 32 arranged therein.

The display driving unit 32 may generate a control signal to be transmitted to the first scan driving circuit SDRV1 and the second scan driving circuit SDRV2. The display driving unit 32 may generate a data signal, and the data signal may be transmitted to the main and auxiliary pixel circuits PCm and PCa via a fan-out line FW and a data line DL connected to the fan-out line FW.

The display driving unit 32 may apply a driving voltage ELVDD to the driving voltage supply line 11 and apply a common voltage ELVSS to the common voltage supply line 13. The driving voltage ELVDD may be applied to the main and auxiliary pixel circuits PCm and PCa through a driving voltage line PL connected to the driving voltage supply line 11, and the common voltage ELVSS may be applied to the common voltage supply line 13 which is connected to an opposite electrode of a display element.

The driving voltage supply line 11 may extend in the x direction from a lower side (in the −y-axis direction) of the main display area MDA. The common voltage supply line 13 has a loop shape having one open side and may partially surround the main display area MDA.

In FIG. 2, one auxiliary display area SDA is shown, but the auxiliary display area SDA may be provided in plural. In this case, the plurality of auxiliary display areas SDA may be spaced apart from one another, wherein a first camera may be arranged to correspond to the component area CA of an auxiliary display area SDA, and a second camera may be arranged to correspond to the component area CA of another auxiliary display area SDA. In some embodiments, a camera may be arranged to correspond to a component area CA of an auxiliary display area SDA, and an infrared sensor may be arranged to correspond to a component area CA of another auxiliary display area SDA. The plurality of auxiliary display areas SDA may have different sizes and/or shapes from one another.

The component area CA may be provided in a circular shape, an elliptical shape, a polygonal shape, or an amorphous shape. In some embodiments, the component area CA may have an octagonal shape. The component area CA may have a shape of a polygon of various shapes, such as a quadrilateral shape, a hexagonal shape, or the like. A portion or all of the component area CA may be surrounded by the main display area MDA, and the other portion may be surrounded by the circuit area PCA.

Figure 4:
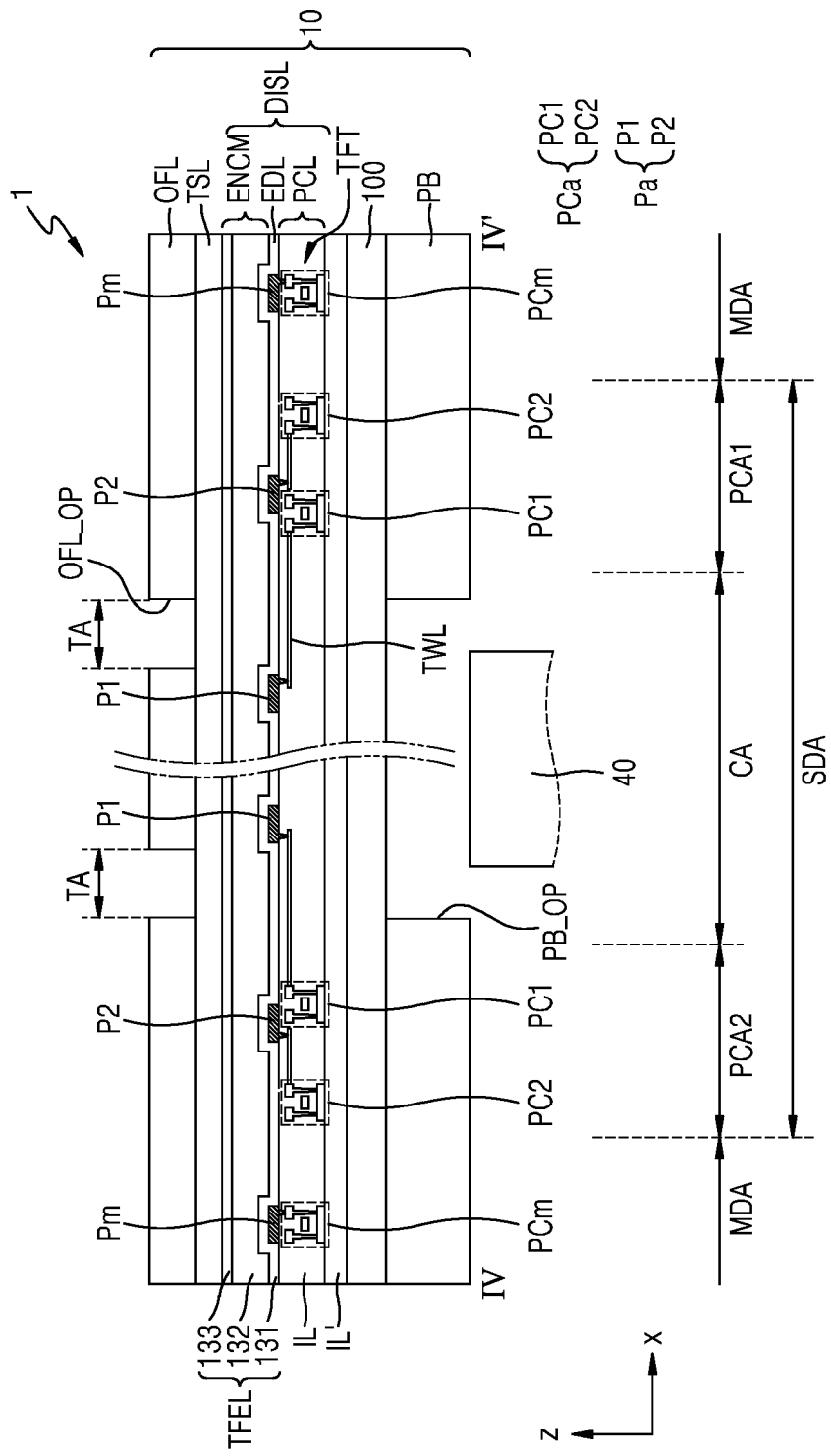
FIG. 4 is a cross-sectional view of a portion of a display panel in FIG. 3, taken along line IV-IV'.

FIG. 4 is a schematic cross-sectional view of a portion of the display panel 10 in FIG. 3, taken along line IV-IV'.

Referring to FIG. 4, the display apparatus 1 may include the display panel 10 and a component 40 overlapping the display panel 10. A cover window (not shown) for covering the display panel 10 may be further arranged on the display panel 10.

The display panel 10 may include the component area CA overlapping the component 40, and the main display area MDA in which a main image is displayed. The display panel 10 may include the substrate 100, a display layer DISL over the substrate 100, a touch screen layer TSL, an optical functional layer OFL, and a panel protective member PB disposed under the substrate 100.

The display layer DISL may include a circuit layer PCL including a thin-film transistor TFT, a display element layer EDL including a light-emitting element as a display element, and an encapsulation member ENCM, such as a thin-film encapsulation layer TFEL or a sealing substrate (not shown). Insulating layers IL and IL' may be disposed between the substrate 100 and the display layer DISL and in the display layer DISL.

The substrate 100 may include an insulating material, such as glass, quartz, a polymer resin, or the like. The substrate 100 may be a rigid substrate or a flexible substrate that is bendable, foldable, rollable, or the like.

The main pixel circuit PCm and a light-emitting element connected thereto may be arranged in the main display area MDA of the display panel 10. The main pixel circuit PCm may include at least one thin-film transistor TFT to control emission of the light-emitting element. The main sub-pixel Pm may be implemented by emission by the light-emitting element.

The auxiliary pixel circuits PCa and light-emitting elements connected thereto may be arranged in the first and second circuit areas PCA1 and PCA2 of the display panel 10. The auxiliary pixel circuit PCa may include at least one thin-film transistor TFT to control emission by the light-emitting element. The auxiliary sub-pixel Pa may be implemented by emission by the light-emitting element.

The first sub-pixels P1 among the auxiliary sub-pixels Pa may be arranged in the component area CA of the display panel 10. In the embodiment, the first pixel circuits PC1 may not be arranged in the component area CA but may be arranged in the first and second circuit areas PCA1 and PCA2. In an embodiment, in FIG. 4, first pixel circuits PC1 arranged on a right side (in the +x direction) when the auxiliary display area SDA is divided in half may be connected to first sub-pixels P1 arranged on a right side (in the +x direction) when the component area CA is divided in half. In addition, first pixel circuits PC1 arranged on a left side (in −x direction) when the auxiliary display area SDA is divided in half may be connected to first sub-pixels P1 arranged on a left side (in −x direction) when the component area CA is divided in half.

The second pixel circuits PC2 may be connected to the second sub-pixel P2 which is arranged in the first and second circuit areas PCA1 and PCA2. In this case, at least a portion of the second sub-pixels P2 may overlap the first pixel circuit PC1.

The first pixel circuit PC1 may include at least one thin-film transistor TFT and may be connected to the first sub-pixel P1 by a connection line TWL. The connection line TWL may include a transparent conductive material.

The component 40, which is an electronic element, may be arranged under the display panel 10 to correspond to the component area CA. The component 40 is a camera using infrared or visible light, and may include an imaging device. In some embodiments, the component 40 may include a solar battery, a flash, an illuminance sensor, a proximity sensor, and/or an iris sensor. In some embodiments, the component 40 may have a function of receiving sound. To minimize the function of the component 40 from being restricted, the component area CA may include the transmission area TA that may transmit light and/or sound output to the outside from the component 40 or traveling toward the component 40 from the outside.

The transmission area TA may include an area of the component area CA where no first sub-pixels P1 are arranged. The transmission area TA may be an area that transmits light/a signal emitted/transmitted from the component 40 or light/a signal incident onto the component 40, the component 40 being arranged to correspond to the component area CA. The connection line TWL connecting the first pixel circuit PC1 and the first sub-pixel P1 to each other may be arranged in the transmission area TA. The connection line TWL may include a transparent conductive material having high transmittance, and thus, even when the connection line TWL is arranged in the transmission area TA, a transmittance of the transmission area TA may be ensured. In a case of a display panel and a display apparatus including the display panel according to an embodiment, when light is transmitted by the component area CA, the light transmittance may be about 10% or more, for example, about 40% or more, about 25% or more, about 50% or more, about 85% or more, and about 90% or more.

In the embodiment, the component area CA has no auxiliary pixel circuits PCa arranged therein, and thus, an area of the transmission area TA may be ensured, thereby further improving the light transmittance.

The display element layer EDL may be covered with the thin-film encapsulation layer TFEL or a sealing substrate. In some embodiments, the thin-film encapsulation layer TFEL may include at least one inorganic encapsulation layer and/or at least one organic encapsulation layer. In an embodiment, the thin-film encapsulation layer TFEL may include a first inorganic encapsulation layer 131, a second inorganic encapsulation layer 133, and an organic encapsulation layer 132 therebetween.

The first inorganic encapsulation layer 131 and the second inorganic encapsulation layer 133 may include one or more inorganic insulating materials, such as silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), and hafnium oxide ($HfO_2$), or zinc oxide (ZnO), and may be formed by using a chemical vapor deposition (CVD) method or the like. The organic encapsulation layer 132 may include a polymer-based material. The polymer-based material may include a silicone-based resin, an acryl-based resin, an epoxy-based resin, polyimide, polyethylene, or the like.

The first inorganic encapsulation layer 131, the organic encapsulation layer 132, and the second inorganic encapsulation layer 133 may be integrally formed as a single body to cover the main display area MDA and the auxiliary display area SDA.

When the display element layer EDL is sealed with a sealing substrate (not shown), the sealing substrate may face the substrate 100 with the display element layer EDL therebetween. A gap may be between the sealing substrate and the display element layer EDL. The sealing substrate may include glass. A sealant including frit or the like may be arranged between the substrate 100 and the sealing substrate, and the sealant may be arranged in the peripheral area DPA described above. The sealant arranged in the peripheral area DPA may surround the display area DA and prevent moisture from penetrating into a side surface of the display area DA.

The touch screen layer TSL may obtain coordinate information according to an external input, for example, a touch event. The touch screen layer TSL may include a touch electrode and touch lines connected to the touch electrode. The touch screen layer TSL may detect an external input by using a self-capacitance method or a mutual capacitance method.

The touch screen layer TSL may be disposed over the thin-film encapsulation layer TFEL. In some embodiments, the touch screen layer TSL may be separately formed on a touch substrate, and coupled onto the thin-film encapsulation layer TFEL via an adhesive layer including an optical clear adhesive (OCA). In an embodiment, the touch screen layer TSL may be disposed directly over the touch screen layer TSL, and in this case, an adhesive layer may not be between the touch screen layer TSL and the thin-film encapsulation layer TFEL.

The optical functional layer OFL may include an anti-reflection layer. The anti-reflection layer may reduce a reflectance of (external) light incident toward the display apparatus 1 from the outside.

In some embodiments, the optical functional layer OFL may include a polarization film. The optical functional layer OFL may include an opening OFL_OP corresponding to the transmission area TA. Thus, a light transmittance of the transmission area TA may be remarkably improved. The opening OFL_OP may be filled with a transparent material, such as an optically clear resin (OCR).

In some embodiments, the optical functional layer OFL may include a filter plate including a black matrix and color filters.

The panel protective member PB may be attached under the substrate 100 to support and protect the substrate 100. The panel protective member PB may include an opening PB_OP corresponding to the component area CA. The opening PB_OP may be provided in the panel protective member PB to improve a light transmittance of the component area CA. The panel protective member PB may include polyethylene terephthalate (PET) or polyimide (PI).

An area of the component area CA may be greater than an area in which the component 40 is arranged. Accordingly, the opening PB_OP provided in the panel protective member PB may not have an area equal to an area of the component area CA.

In addition, the component area CA may have a plurality of components 40 arranged therein. The plurality of components 40 may have different functions from each other. For example, the plurality of components 40 may include at least two of a camera (an imaging device), a solar battery, a flash, a proximity sensor, an illuminance sensor, and an iris sensor.

In FIG. 4, a bottom metal layer (BML) is not under the component area CA, but the display apparatus 1 according to an embodiment may include a BML for preventing external light from reaching the auxiliary sub-pixel Pa.

In FIG. 4, the auxiliary pixel circuit PCa and the main pixel circuit PCm are shown in a same manner, but the auxiliary pixel circuit PCa and the main pixel circuit PCm may have different configurations from each other. For example, a storage capacitor of the auxiliary pixel circuit PCa may be configured to have a greater capacitance than a storage capacitor of the main pixel circuit PCm. For example, a driving thin-film transistor of the auxiliary pixel circuit PCa may be different from that of the main pixel circuit PCm with respect to a shape of a channel area.

Figure 5A:
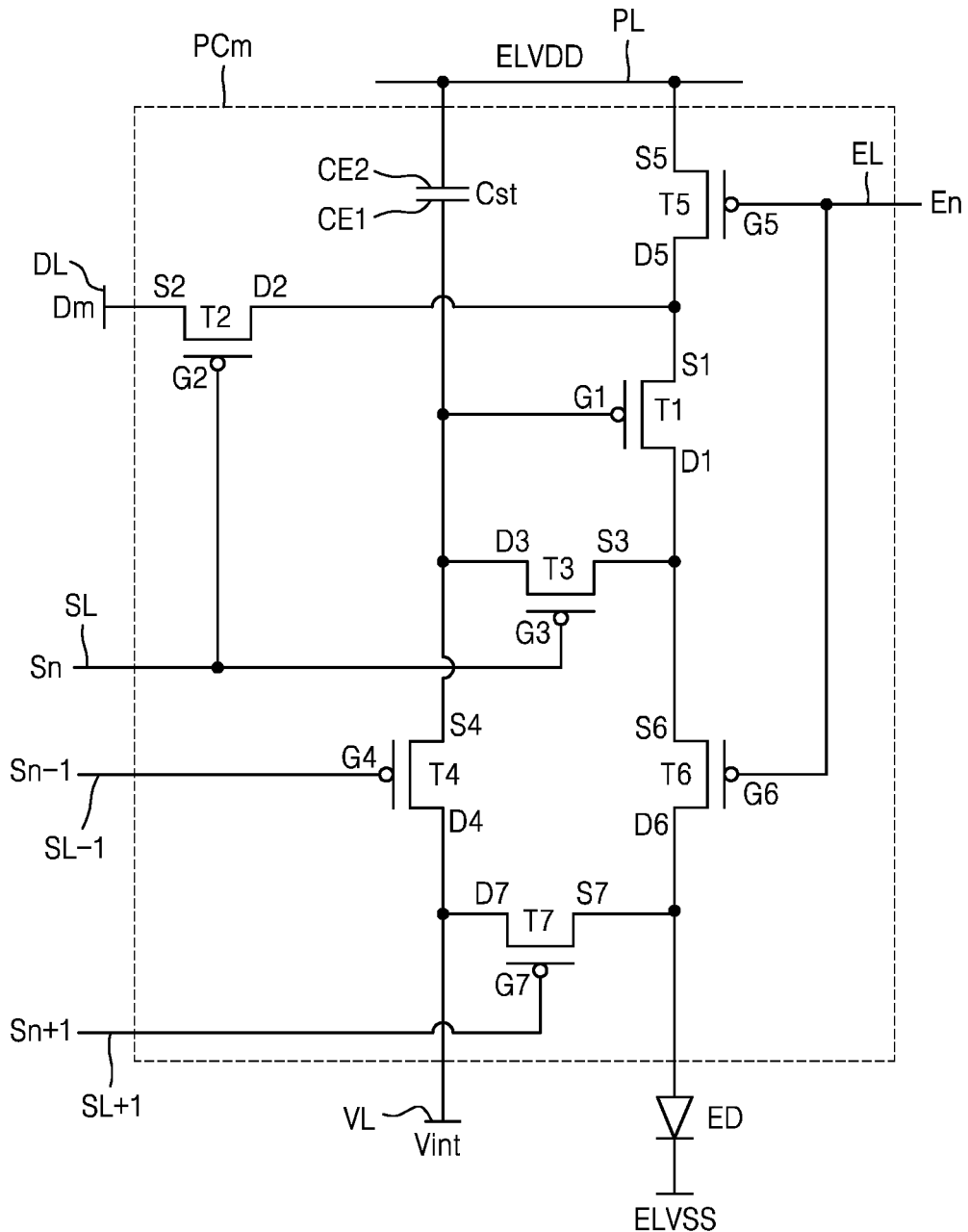
FIG. 5A is an equivalent circuit diagram of a main pixel circuit configured to drive a main sub-pixel according to an embodiment.

FIG. 5A is an equivalent circuit diagram of a main pixel circuit PCm for driving a main sub-pixel according to an embodiment.

Referring to FIG. 5A, the main pixel circuit PCm may include a first transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, and a main storage capacitor Cst.

In FIG. 5A, a scan line SL, a previous scan line SL−1, a next scan line SL+1, an emission control line EL, a data line DL (which are collectively referred to as "signal lines SL, SL−1, SL+1, EL, and DL"), an initialization voltage line VL, and the driving voltage line PL, but the embodiment is not limited thereto. In another embodiment, at least any one of the signal lines SL, SL−1, SL+1, EL, and DL, and/or the initialization voltage line VL may be shared with neighboring pixel circuits.

A driving drain electrode D1 of the first transistor T1 may be electrically connected to a light-emitting device ED through the emission control thin-film transistor T6. A driving source electrode S1 of the first transistor T1 may be electrically connected to an operation control drain electrode D5 of the operation control thin-film transistor T5 and a switching drain electrode D2 of the switching thin-film transistor T2. The first transistor T1 may receive a data signal Dm according to a switching operation of the switching thin-film transistor T2 and supply a driving current to the light-emitting device ED. The first transistor T1 may be a driving thin-film transistor.

A switching gate electrode G2 of the switching thin-film transistor T2 may be connected to the scan line SL, and a switching source electrode S2 of the switching thin-film transistor T2 may be connected to the data line DL. The switching drain electrode D2 of the switching thin-film transistor T2 may be connected to the driving voltage line PL via the operation control thin-film transistor T5 and also connected to the driving source electrode S1 of the first transistor T1. The switching thin-film transistor T2 is turned on according to a scan signal Sn received via the scan line SL and performs a switching operation of transmitting, to the driving source electrode S1 of the first transistor T1, the data signal Dm received via the data line DL.

A compensation gate electrode G3 of the compensation thin-film transistor T3 may be connected to the scan line SL. While being connected to a driving drain electrode D1 of the first transistor T1, a compensation source electrode S3 of the compensation thin-film transistor T3 may be connected to a pixel electrode of the light-emitting device ED through the emission control thin-film transistor T6. A compensation drain electrode D3 of the compensation thin-film transistor T3 may be connected to any electrode of the main storage capacitor Cst, a first initialization source electrode S4 of the first initialization thin-film transistor T4, and a driving gate electrode G1 of the first transistor T1. The compensation thin-film transistor T3 is turned on according to the scan signal Sn received via the scan line SL and connects the driving gate electrode G1 and the driving drain electrode D1 of the first transistor T1 to each other to diode-connect the first transistor T1.

A first initialization gate electrode G4 of the first initialization thin-film transistor T4 may be connected to the previous scan line SL−1. A first initialization drain electrode D4 of the first initialization thin-film transistor T4 may be connected to an initialization voltage line VL. The first initialization source electrode S4 of the first initialization thin-film transistor T4 may be connected to any one of the main storage capacitor Cst, the compensation drain electrode D3 of the compensation thin-film transistor T3, and the driving gate electrode G1 of the first transistor T1. The first initialization thin-film transistor T4 is turned on according to a previous scan signal Sn−1 received via the previous scan line SL−1, and performs an initialization operation of transferring an initialization voltage Vint to the driving gate electrode G1 of the first transistor T1 and initializing a voltage at the driving gate electrode G1 of the first transistor T1.

An operation control gate electrode G5 of the operation control thin-film transistor T5 may be connected to the emission control line EL. An operation control source electrode S5 of the operation control thin-film transistor T5 may be connected to the driving voltage line PL. The operation control drain electrode D5 of the operation control thin-film transistor T5 is connected to the driving source electrode S1 of the first transistor T1 and the switching drain electrode D2 of the switching thin-film transistor T2.

An emission control gate electrode G6 of the emission control thin-film transistor T6 may be connected to the emission control line EL. An emission control source electrode S6 of the emission control thin-film transistor T6 may be connected to the driving drain electrode D1 of the first transistor T1 and the compensation source electrode S3 of the compensation thin-film transistor T3. An emission control drain electrode D6 of the emission control thin-film transistor T6 may be electrically connected to a pixel electrode of the light-emitting device ED. As the operation control thin-film transistor T5 and the emission control thin-film transistor T6 may be turned on at a same time according to an emission control signal En received via the emission control line EL, the driving voltage ELVDD is transferred to the light-emitting device ED, and thus, a driving current flows in the light-emitting device ED.

A second initialization gate electrode G7 of the second initialization thin-film transistor T7 may be connected to the next scan line SL+1. A second initialization source electrode S7 of the second initialization thin-film transistor T7 may be connected to the pixel electrode of the light-emitting device ED. A second initialization drain electrode D7 of the second initialization thin-film transistor T7 may be connected to the initialization voltage line VL. The second initialization thin-film transistor T7 may be turned on according to a next scan signal Sn+1 received via the next scan line SL+1 and initialize the pixel electrode of the light-emitting device ED.

In FIG. 5A, the first initialization thin-film transistor T4 and the second initialization thin-film transistor T7 are connected to the previous scan line SL−1 and the next scan line SL+1, respectively. However, the embodiment is not limited thereto. In another example, both the first initialization thin-film transistor T4 and the second initialization thin-film transistor T7 may be connected to the previous scan line SL−1 and driven according to the previous scan signal Sn−1.

An electrode of the main storage capacitor Cst may be connected to the driving voltage line PL. The other electrode of the main storage capacitor Cst may be connected to the driving gate electrode G1 of the first transistor T1, the compensation drain electrode D3 of the compensation thin-film transistor T3, and the first initialization source electrode S4 of the first initialization thin-film transistor T4.

An opposite electrode (for example, a cathode) of the light-emitting device ED receives the common voltage ELVSS. The light-emitting device ED receives a driving current from the first transistor T1 to emit light.

As for the main pixel circuit PCm, the number of thin-film transistors and storage capacitors and a circuit design is not limited to the illustration in FIG. 7, and various modifications may be made.

Figure 5B:
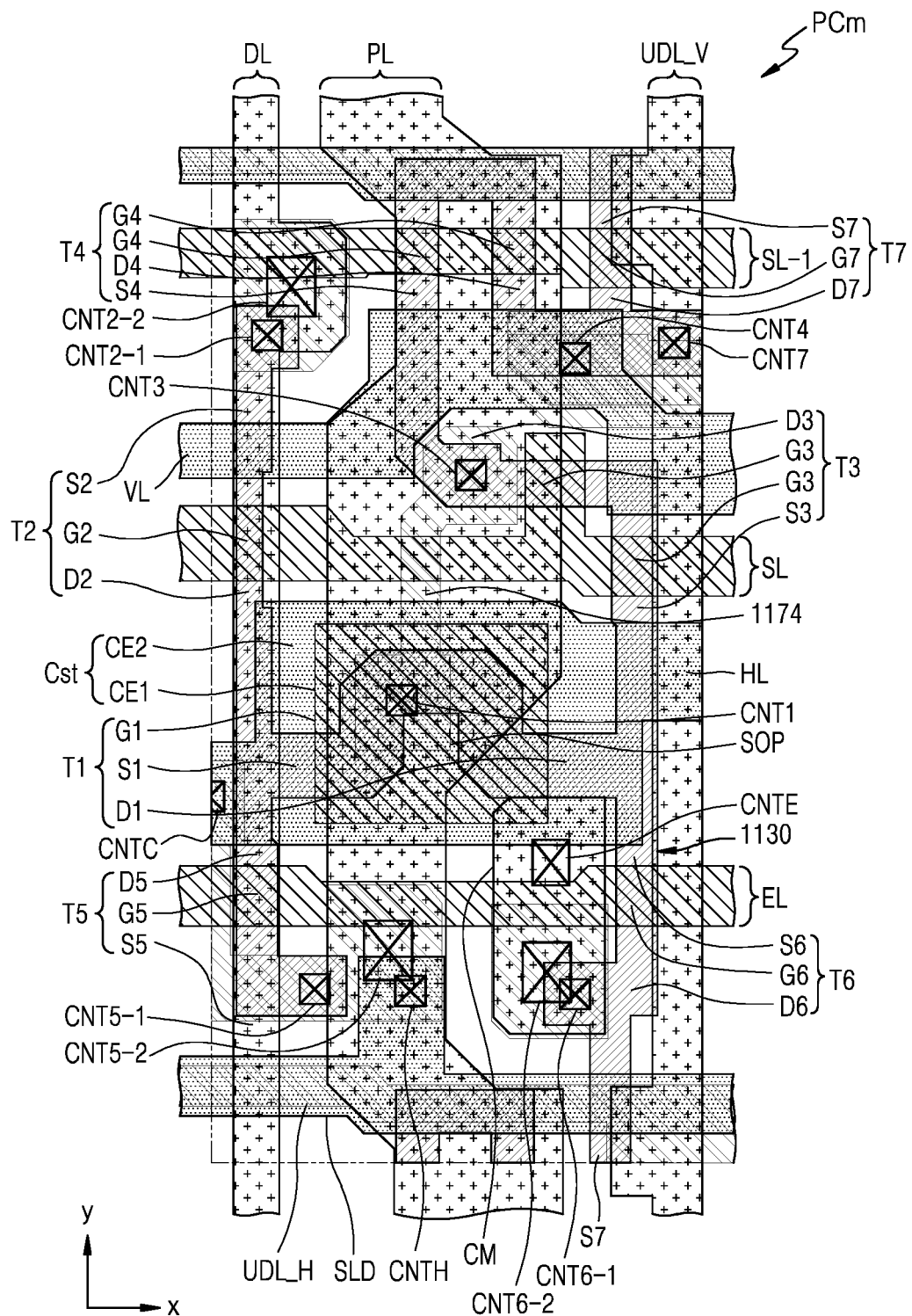
FIG. 5B is a plan view of any one main pixel circuit according to an embodiment.

FIG. 5B is a plan view illustrating a main pixel circuit PCm according to an embodiment.

Referring to FIG. 5B, the first transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are arranged along a semiconductor layer 1130. The semiconductor layer 1130 may be disposed over a substrate having a buffer layer arranged formed thereon, the buffer layer including an inorganic insulating material.

Some areas of the semiconductor layer 1130 correspond to semiconductor layers of the first transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. In other words, the semiconductor layers of the first transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be understood as being connected to one another and curved in various shapes.

The semiconductor layer 1130 includes a channel area, and a source area and a drain area at opposite sides of the channel area, respectively, and the source area and the drain area may be understood as a source electrode and a drain electrode of a corresponding thin-film transistor, respectively. Hereinafter, for convenience, the source area and the drain area will be referred to as the source electrode and the drain electrode, respectively.

The first transistor T1 includes the driving gate electrode G1 overlapping a driving channel area, and the driving source electrode S1 and the driving drain electrode D1 at opposite sides of the driving channel area. The driving channel area overlapping the driving gate electrode G1 has a curved shape such as an omega shape, thereby forming a long channel within a narrow space. When the driving channel area is long, a driving range of a gate voltage widens, and thus, a gradation of light emitted from an organic light-emitting diode (OLED), which is a light-emitting element, may be more precisely controlled, thereby improving display quality.

The switching thin-film transistor T2 includes the switching gate electrode G2 overlapping a switching channel area, and the switching source electrode S2 and the switching drain electrode D2 at opposite sides of the switching channel area. The switching gate electrode G2 may be connected to the scan line SL, and the switching source electrode S2 may be connected to the data line DL through a $(2\text{-}1)^{st}$ contact hole CNT2-1 and a $(2\text{-}2)^{nd}$ contact hole CNT2-2. The switching drain electrode D2 may be connected to the driving source electrode S1.

The compensation thin-film transistor T3, which is a dual thin-film transistor, may include a plurality of compensation gate electrodes G3 overlapping two compensation channel areas, and the compensation gate electrode G3 may be connected to the scan line SL. The compensation thin-film transistor T3 may include the compensation source electrode S3 and the compensation drain electrode D3 arranged at opposite sides of the compensation gate electrode G3. The compensation thin-film transistor T3 may be connected to the driving gate electrode G1 of the first transistor T1 through a node connection line 1174 to be described later.

The first initialization thin-film transistor T4, which is a dual thin-film transistor, may include the first initialization gate electrode G4 overlapping two first initialization channel areas, and the first initialization source electrode S4 and the first initialization drain electrode D4 arranged at opposite ends of the first initialization gate electrode G4. The first initialization gate electrode G4 may be connected to the initialization voltage line VL through a fourth contact hole CNT4.

The operation control thin-film transistor T5 may include the operation control gate electrode G5 overlapping an operation control channel area, and the operation control source electrode S5 and the operation control drain electrode D5 at opposite sides of the operation control gate electrode G5. The operation control drain electrode D5 may be connected to the driving source electrode S1. The operation control gate electrode G5 may be connected to the emission control line EL. The operation control source electrode S5 may be connected to the driving voltage line PL through a $(5\text{-}1)^{st}$ contact hole CNT5-1 and a $(5\text{-}2)^{nd}$ contact hole CNT5-2.

The emission control thin-film transistor T6 may include the emission control gate electrode G6 overlapping an emission control channel area, and the emission control source electrode S6 and the emission control drain electrode D6 at opposite sides of the emission control gate electrode G6. The emission control gate electrode G6 may be connected to the emission control line EL. The emission control source electrode S6 of the emission control thin-film transistor T6 may be connected to the driving drain electrode D1 of the first transistor T1 and the compensation source electrode S3 of the compensation thin-film transistor T3. The emission control drain electrode D6 of the emission control thin-film transistor T6 may be electrically connected to the pixel electrode of the light-emitting device ED through a $(6\text{-}1)^{st}$ contact hole CNT6-1, a $(6\text{-}2)^{nd}$ contact hole CNT6-2, and a pixel contact hole CNTE.

The second initialization thin-film transistor T7 may include the second initialization gate electrode G7 overlapping a second initialization channel area, and the second initialization source electrode S7 and the second initialization drain electrode D7 at opposite sides of the second initialization gate electrode G7. The second initialization source electrode S7 of the second initialization thin-film transistor T7 may be connected to the pixel electrode of the light-emitting device ED. The second initialization drain electrode D7 of the second initialization thin-film transistor T7 may be connected to the initialization voltage line VL through a seventh contact hole CNT7 and the fourth contact hole CNT4.

The above-described thin-film transistors may be connected to the signal lines SL, SL−1, EL, and DL, the initialization voltage line VL, and the driving voltage line PL.

The scan line SL may extend in the x direction. Some areas of the scan line SL may correspond to the switching gate electrode G2 and the compensation gate electrode G3. For example, areas of the scan line SL that overlap the channel areas of the switching thin-film transistor T2 and the compensation thin-film transistor T3 may be the switching gate electrode G2 and the compensation gate electrode G3, respectively.

The previous scan line SL−1 extends in the x direction, but some areas of the previous scan line SL−1 may correspond to the first initialization gate electrode G4 and the second initialization gate electrode G7, respectively. For example, areas overlapping the channel areas of the first initialization thin-film transistor T4 and the second initialization thin-film transistor T7 in the previous scan line SL−1 may be the first initialization gate electrode G4 and the second initialization gate electrode G7, respectively.

The emission control line EL extends in the x direction. Some areas of the emission control line EL may correspond to the operation control gate electrode G5 and the emission control gate electrode G6, respectively. For example, areas overlapping the channel areas of the operation control thin-film transistor T5 and the emission control thin-film transistor T6 in the emission control line EL may be the operation control gate electrode G5 and the emission control gate electrode G6, respectively.

The driving gate electrode G1 is a floating electrode, and may be connected to the compensation thin-film transistor T3 through the node connection line 1174 described above.

An electrode voltage line HL and the initialization voltage line VL may be arranged on the previous scan line SL−1, the scan line SL, the emission control line EL, and the driving gate electrode G1 with an insulating layer(s) therebetween.

The electrode voltage line HL may extend in the x direction and cross the data line DL and the driving voltage line PL. A portion of the electrode voltage line HL may cover at least a portion of the driving gate electrode G1 and form the main storage capacitor Cst together with the driving gate electrode G1. For example, the driving gate electrode G1 may function as a lower electrode CE1 of the main storage capacitor Cst, and a portion of the electrode voltage line HL may function as an upper electrode CE2 of the main storage capacitor Cst.

The upper electrode CE2 of the main storage capacitor Cst may be electrically connected to the driving voltage line PL. Regarding this, the electrode voltage line HL may be connected to the driving voltage line PL through a capacitor contact hole CNTC and the $(5\text{-}2)^{nd}$ contact hole CNT5-2. Thus, the electrode voltage line HL may have a same voltage level (a constant voltage) as the driving voltage line PL. For example, the electrode voltage line HL may have a constant voltage of about +5 V. The electrode voltage line HL may be understood as a transverse driving voltage line.

Because the driving voltage line PL extends in the y direction, and the electrode voltage line HL electrically connected to the driving voltage line PL extends in the x direction crossing the y direction, the plurality of driving voltage lines PL and the plurality of electrode voltage lines HL may form a mesh structure in a display area.

The initialization voltage line VL is connected to the first initialization thin-film transistor T4 through the fourth contact hole CNT4. The initialization voltage line VL may be connected to the second initialization thin-film transistor T7 through the seventh contact hole CNT7 and the fourth contact hole CNT4. The initialization voltage line VL may have a constant voltage (for example, about −2 V, etc.).

The node connection line 1174 and a horizontal connection line UDL_H may be arranged on the electrode voltage line HL and the initialization voltage line VL described above, with an insulating layer(s) therebetween.

One end of the node connection line 1174 may be connected to the compensation drain electrode D3 through a third contact hole CNT3, and another end of the node connection line 1174 may be connected to the driving gate electrode G1 through a first contact hole CNT1. The upper electrode CE2 may include a first storage opening SOP, and the first contact hole CNT1 may be arranged in a first storage opening SOP.

The horizontal connection line UDL_H, which is a portion of a data connection line DWL electrically connecting data lines which are spaced apart from each other with respect to the auxiliary display area SDA, may extend in the x direction. The horizontal connection line UDL_H may overlap a shielding line SLD arranged between the horizontal connection line UDL_H and an insulating layer. The shielding line SLD may be connected to the driving voltage line PL through a horizontal contact hole CNTH and the $(5-2)^{nd}$ contact hole CNT5-2 and have a same voltage level (a constant voltage) as the driving voltage line PL. For example, the shielding line SLD may have a constant voltage of about +5 V.

The data line DL, the driving voltage line PL, a vertical connection line UDL_V, and a connection electrode CM may be arranged on the node connection line 1174 and the horizontal connection line UDL_H described above, with an insulating layer(s) therebetween.

The data line DL extends in the y direction and may be electrically connected to the switching source electrode S2 of the switching thin-film transistor T2 through the $(2-1)^{st}$ contact hole CNT2-1 and the $(2-2)^{nd}$ contact hole CNT2-2.

The driving voltage line PL extends in the y direction and as described above, may be connected to the electrode voltage line HL through the $(5-2)^{nd}$ contact hole CNT5-2 and the capacitor contact hole CNTC. In addition, the driving voltage line PL may be connected to the operation control thin-film transistor T5 through the $(5-2)^{nd}$ contact hole CNT5-2 and the $(5-1)^{st}$ contact hole CNT5-1.

The vertical connection line UDL_V, which is a portion of the data connection line DWL electrically connecting data lines that are spaced apart from each other with respect to the auxiliary display area SDA, may extend in the y direction.

The connection electrode CM may electrically connect a pixel electrode and the emission control drain electrode D6 to each other. In other words, the emission control drain electrode D6 may be connected to the connection electrode CM through the $(6-1)^{st}$ contact hole CNT6-1 and the $(6-2)^{nd}$ contact hole CNT6-2, and the connection electrode CM may be connected to the pixel electrode through the pixel contact hole CNTE.

Figure 6A:
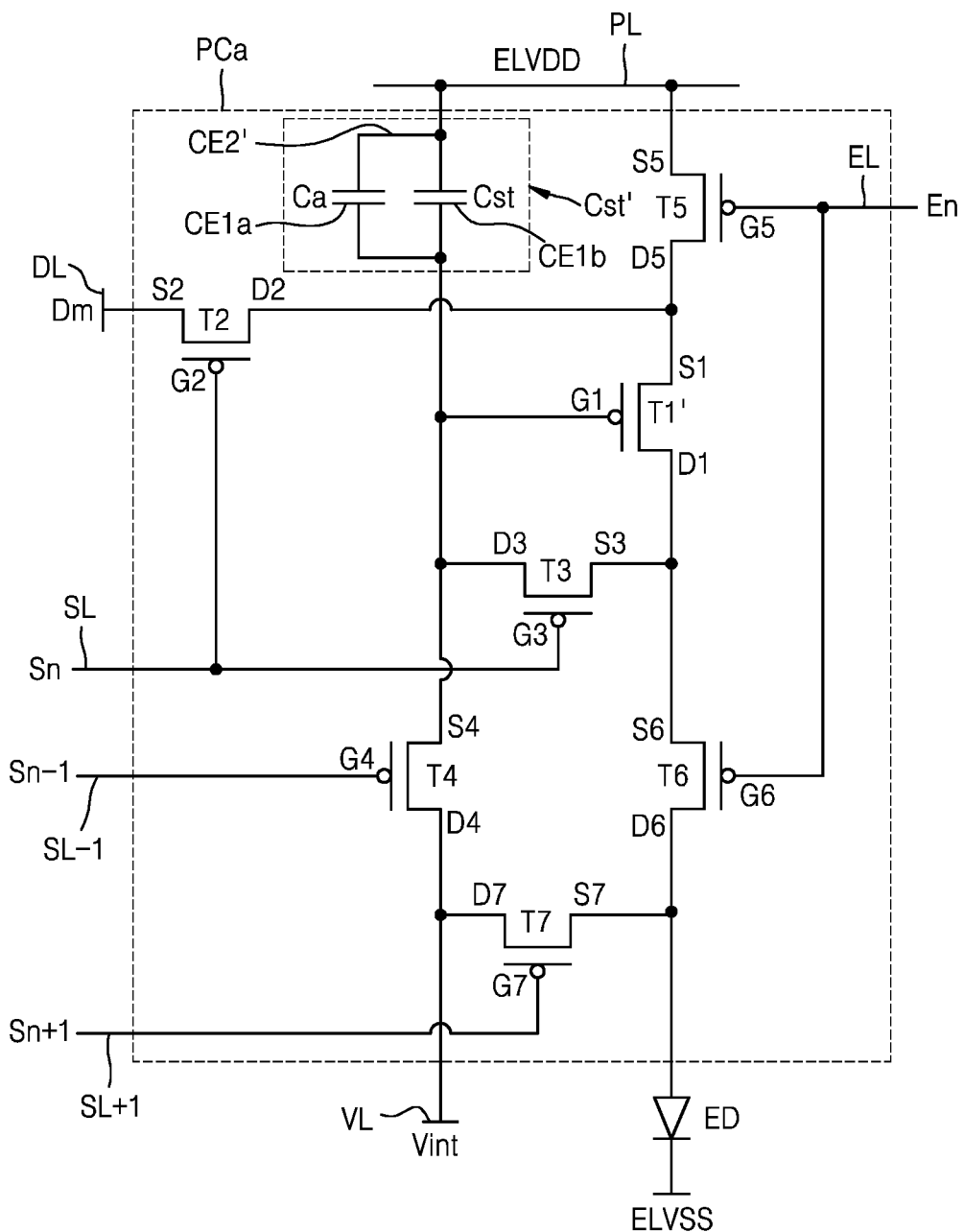
FIG. 6A is an equivalent circuit diagram of an auxiliary pixel circuit configured to drive an auxiliary sub-pixel according to an embodiment.

FIG. 6A is an equivalent circuit diagram of an auxiliary pixel circuit PCa for driving an auxiliary sub-pixel according to an embodiment.

Referring to FIG. 6A, like the main pixel circuit PCm, the auxiliary pixel circuit PCa may include a second transistor T1', the switching thin-film transistor T2, the compensation thin-film transistor T3, the first initialization thin-film transistor T4, the operation control thin-film transistor T5, the emission control thin-film transistor T6, and the second initialization thin-film transistor T7. The second transistor T1' may be a driving thin-film transistor.

The auxiliary pixel circuit PCa may include an auxiliary storage capacitor Cst' having a larger capacity than the main storage capacitor Cst of the main pixel circuit PCm of FIG. 5A. The auxiliary storage capacitor Cst' may include the main storage capacitor Cst and an additional storage capacitor Ca connected in parallel to the main storage capacitor Cst. Because the auxiliary pixel circuit PCa further includes the additional storage capacitor Ca, a capacity of the auxiliary storage capacitor Cst' included in the auxiliary pixel circuit PCa may be greater than a capacity of the main storage capacitor Cst included in the main pixel circuit PCm. For example, a capacitance of the main storage capacitor Cst may be about 61 femtofarad (fF), and a capacitance of the auxiliary storage capacitor Cst' may be about 368 fF.

A connection relationship among the respective thin-film transistors T1 to T7 included in the auxiliary pixel circuit PCa may be a same as a connection relationship among the respective thin-film transistors T1 to T7 included in the main pixel circuit PCm.

Figure 6B:
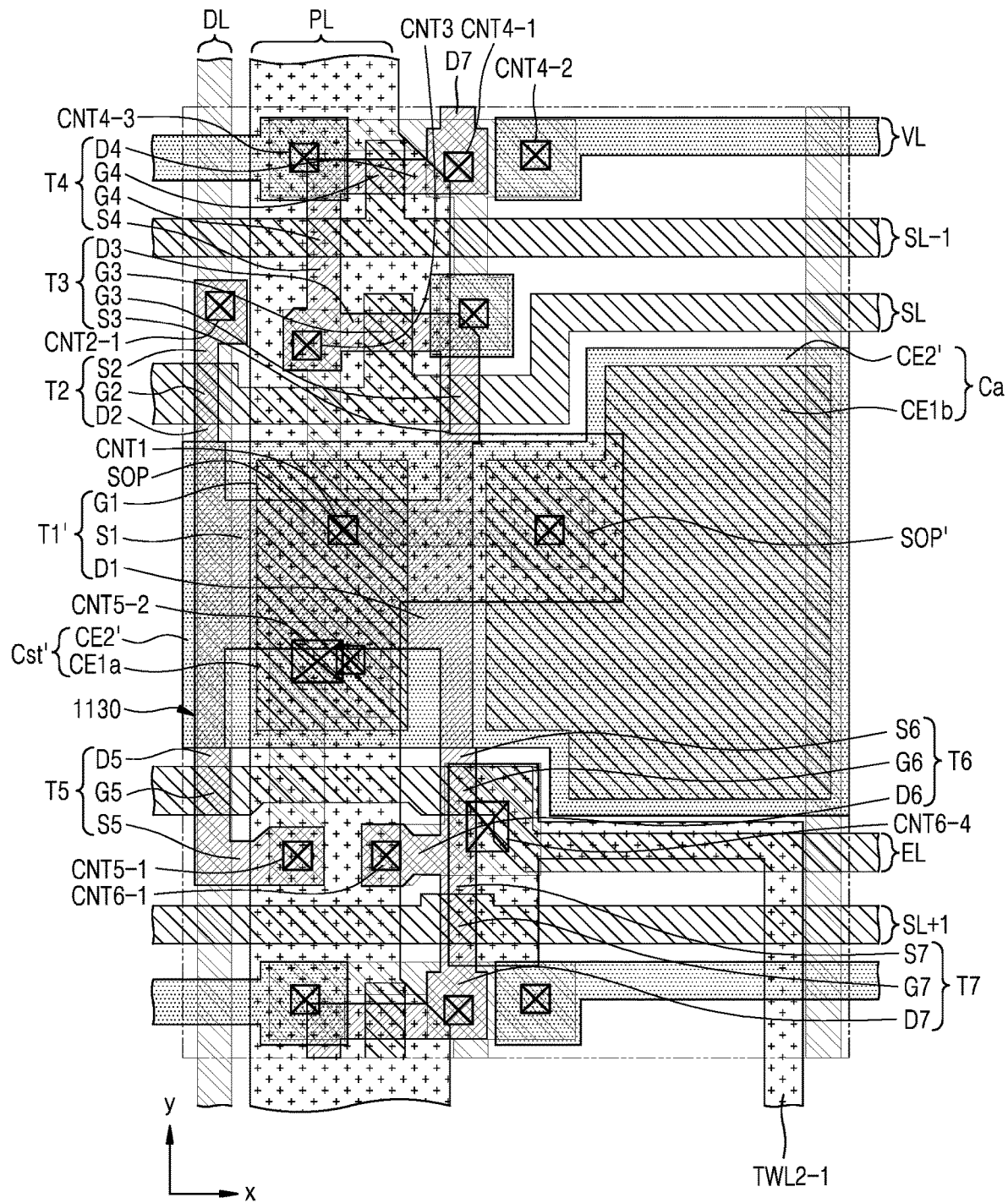
FIG. 6B is a plan view of any one auxiliary pixel circuit according to an embodiment.

FIG. 6B is a plan view illustrating any one auxiliary pixel circuit according to an embodiment.

Referring to FIG. 6B, like the main pixel circuit PCm, the auxiliary pixel circuit PCa includes the second transistor T1', the switching thin-film transistor T2, the compensation thin-film transistor T3, the first initialization thin-film transistor T4, the operation control thin-film transistor T5, the emission control thin-film transistor T6, and the second initialization thin-film transistor T7, and the respective thin-film transistors may have a same connection relationship as in the main pixel circuit PCm.

Compared with the main pixel circuit PCm, in the auxiliary pixel circuit PCa of FIG. 6B, the capacitance of the auxiliary storage capacitor Cst' is greater than the capacitance of the main storage capacitor Cst. In addition, the auxiliary pixel circuit PCa differs from the main pixel circuit PCm in that, in the former, the data line DL is arranged between the initialization voltage line VL and the driving voltage line PL with an insulating layer(s) therebetween, and that the emission control drain electrode D6 is connected to the $(2-1)^{st}$ connection line TWL2-1 through the $(6-1)^{st}$ contact hole CNT6-1 and a $(6-4)^{th}$ contact hole CNT6-4.

The auxiliary storage capacitor Cst' may include a first lower electrode CE1a, a second lower electrode CE1b, and an auxiliary upper electrode CE2'. The first lower electrode CE1a may also perform a function of the driving gate electrode G1. The second lower electrode CE1b is arranged on a same layer as the first lower electrode CE1a, but may be spaced apart from the first lower electrode CE1a with the semiconductor layer 1130 therebetween, in a plan view. When the second lower electrode CE1b overlaps the semiconductor layer 1130, an undesired signal may be generated, and thus, the second lower electrode CE1b may not overlap the semiconductor layer 1130. The auxiliary upper electrode CE2' may have a size that covers both of the first lower electrode CE1a and the second lower electrode CE1b. The first lower electrode CE1a may be connected to the second lower electrode CE1b by using a bridge line 1175. The auxiliary upper electrode CE2' may include a second storage opening SOP' having a single closed curve shape, and the bridge line 1175 may be connected to the first lower electrode CE1a and the second lower electrode CE1b through the first contact hole CNT1 in the first storage opening SOP and an auxiliary contact hole CNTa in a storage capacitor opening SOP', respectively.

The initialization voltage line VL extends in the x direction, but may have a gap, and the first initialization drain electrode D4 may be arranged in the gap. The first initialization drain electrode D4 may be connected to the initialization voltage line VL through a $(4-1)^{st}$ contact hole CNT4-1, a $(4-2)^{nd}$ contact hole CNT4-2, and a $(4-3)^{rd}$ contact hole CNT4-3.

Figure 7A:
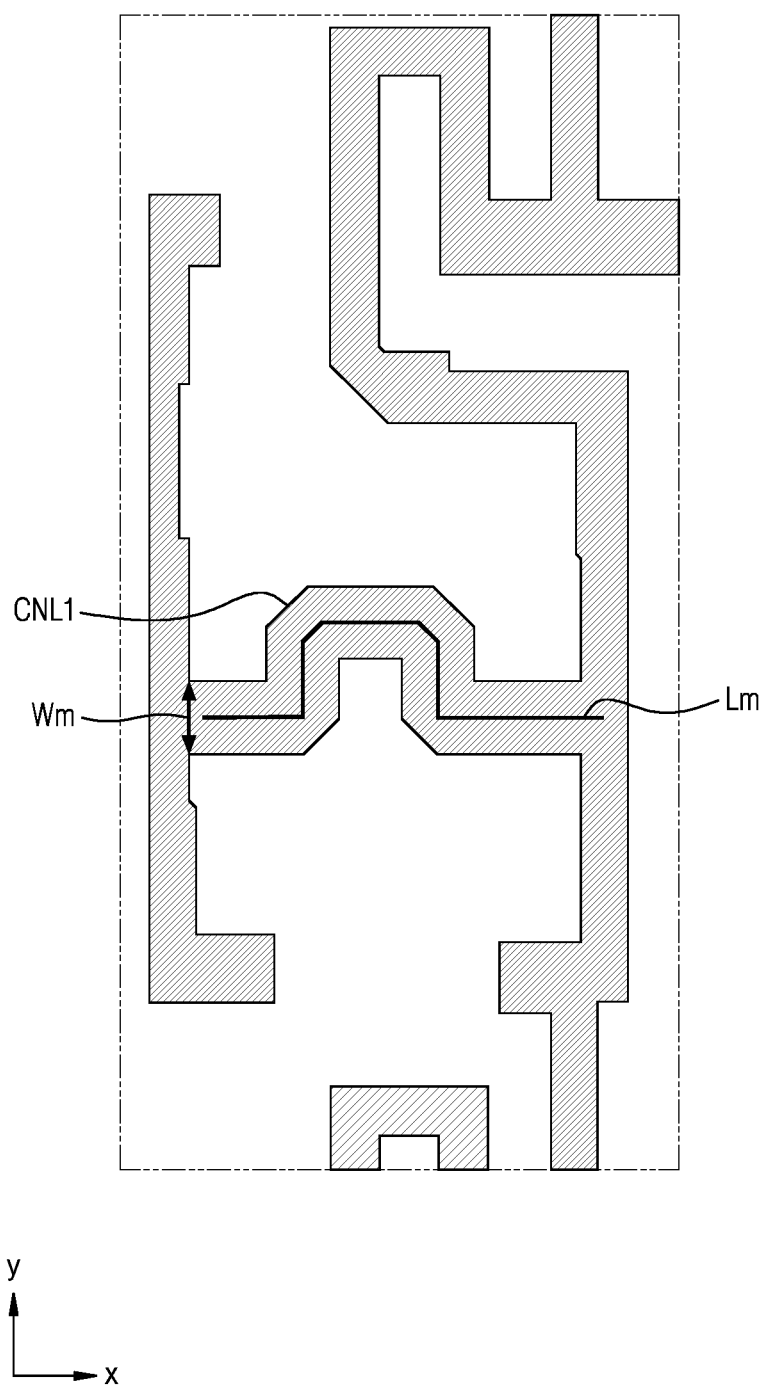
FIG. 7A is a cross-sectional view of a semiconductor layer of a main pixel circuit according to an embodiment.
Figure 7B:
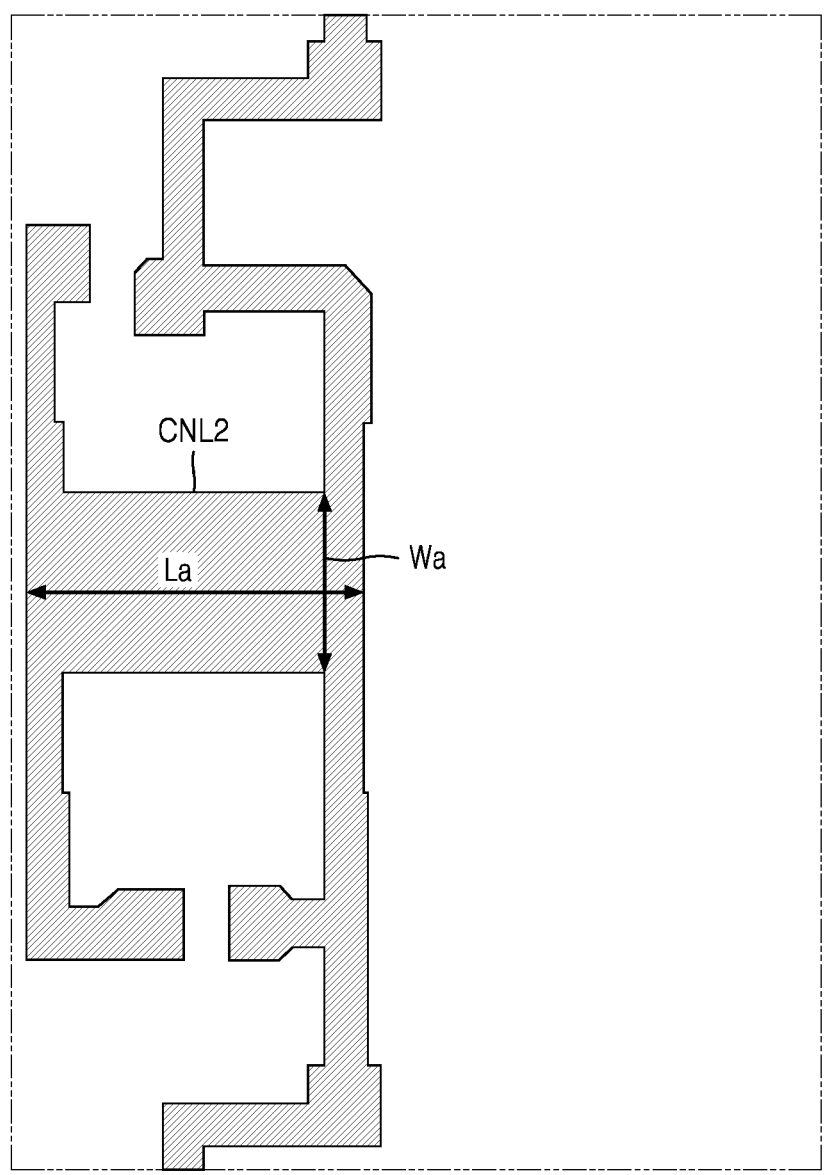
FIG. 7B is a cross-sectional view of a semiconductor layer of an auxiliary pixel circuit according to an embodiment.

FIG. 7A is a cross-sectional view schematically illustrating a semiconductor layer of a main pixel circuit according to an embodiment. FIG. 7B is a cross-sectional view schematically illustrating a semiconductor layer of an auxiliary pixel circuit according to an embodiment.

Referring to FIGS. 7A and 7B, a first channel area CNL1 of the first transistor T1 of the main pixel circuit PCm has a bent shape. A ratio (Wm/Lm) of a main width Wm to a main length Lm, where the main width Wm is a width in the y direction of the first channel area CNL1, and the main length Lm is a length in the x direction of the first channel area CNL1 along the curve, may be referred to as an aspect ratio of the first channel area CNL1. A second channel area CNL2 of the second transistor T1' of the auxiliary pixel circuit PCa has a quadrilateral shape with no bending portions. A ratio (Wa/La) of an auxiliary width Wa to an auxiliary length La, where the auxiliary width Wa is a width in the y direction of the second channel area CNL2, and the auxiliary length La is a length in the y direction of the second channel area CNL2, may be referred to as an aspect ratio of the second channel area CNL2. The auxiliary width Wa may be greater than the main width Wm. The auxiliary length La may be less than the main length Lm. For example, the main width Wm may be about 3-4 μm, the main length Lm may be about 17-18 μm, the auxiliary width Wa may be about 9-11 μm, and the auxiliary length La may be about 9-11 μm.

Figure 8A:
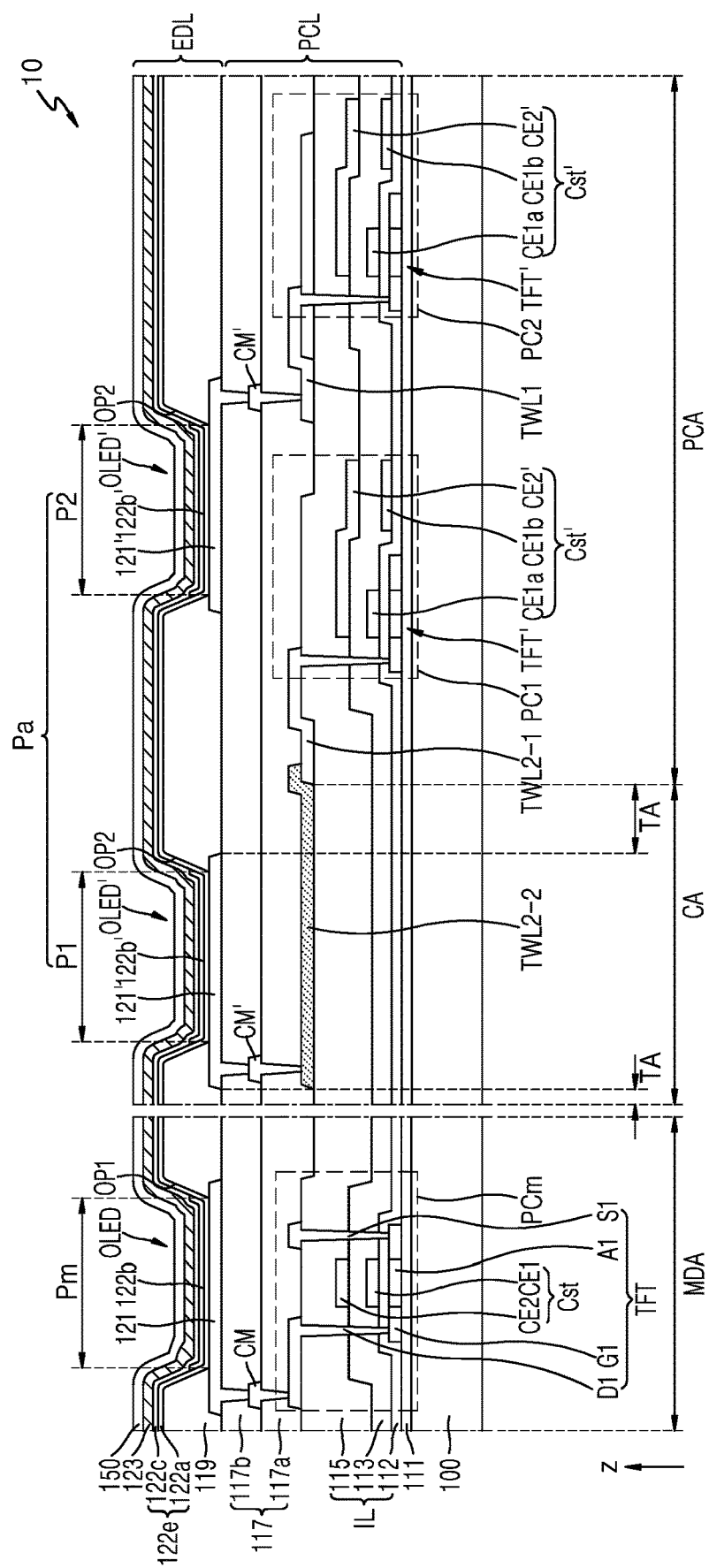
FIG. 8A is a cross-sectional view of a portion of a display area, a component area, and a circuit area of a display panel, according to an embodiment.

FIG. 8A is a schematic cross-sectional view illustrating a portion of a display area MDA, a component area CA, and a circuit area PCA of a display panel 10.

Referring to FIG. 8A, a main sub-pixel Pm may be arranged in the main display area MDA, and an auxiliary sub-pixel Pa and a transmission area Ta may be included in the component area CA and the circuit area PCA. A main pixel circuit PCm and a main organic light-emitting diode OLED that is a display element connected to the main pixel circuit PCm may be arranged in the main display area MDA, the main pixel circuit PCm including a main thin-film transistor TFT and a main storage capacitor Cst. An auxiliary organic light-emitting diode OLED' may be arranged in the component area CA and the circuit area PCA. First and second auxiliary pixel circuits PC1 and PC2 each including an auxiliary thin-film transistor TFT' and an auxiliary storage capacitor Cst' may be arranged in the circuit area PCA. A $(2-1)^{st}$ connection line TWL2-1 and a $(2-2)^{nd}$ connection line TWL2-2 connecting the first pixel circuit PC1 and the auxiliary organic light-emitting diode OLED' to each other may be arranged in the component area CA. A first connection line TWL1 connecting the second pixel circuit PC2 and the auxiliary organic light-emitting diode OLED' to each other may be arranged in the circuit area PCA.

In the embodiment, the first pixel circuit PC1 may be connected to a first sub-pixel P1 arranged in the component area CA, and the second pixel circuit PC2 may be connected to a second sub-pixel P2 arranged in the circuit area PCA. The second sub-pixels P2 may be arranged in a regular manner so as to minimize visual disparity from the main display area MDA and improve visibility. Some of the second sub-pixels P2 arranged in a regular manner may overlap the first pixel circuit PC1.

In addition, in the first and second pixel circuits PC1 and PC2 may differ from the main pixel circuit PCm with respect to a configuration of a driving thin-film transistor and/or a storage capacitor.

In the embodiment, an organic light-emitting diode is used as a display element, but in another embodiment, an inorganic light-emitting element or a quantum dot light-emitting element may be used as a display element.

Elements included in the display panel 10 will now be described according to a stacked order thereof. In the display panel 10, a substrate 100, a buffer layer 111, a circuit layer PCL, and a display element layer EDL may be stacked.

The substrate 100 may include an insulating material, such as glass, quartz, a polymer resin, and the like. The substrate 100 may be a rigid substrate, or a flexible substrate that is bendable, foldable, rollable, or the like.

The buffer layer 111 may be disposed over the substrate 100 and reduce or block the infiltration of foreign materials, moisture, or ambient air from below the substrate 100 and provide a flat surface on the substrate 100. The buffer layer 111 may include an inorganic material such as an oxide or a nitride, an organic material, or an organic and inorganic composite, and may have a single-layer or multilayer structure of an inorganic material and an organic material. The display panel 10 may further include a barrier layer (not shown) between the substrate 100 and the buffer layer 111 to block infiltration of ambient air. In some embodiments, the buffer layer 111 may include silicon oxide ($SiO_2$) or silicon nitride ($SiN_x$).

The circuit layer PCL is disposed over the buffer layer 111 and may include the main and auxiliary pixel circuits PCm and PCa, a first gate insulating layer 112, a second gate insulating layer 113, an interlayer insulating layer 115, and a planarization layer 117. The main pixel circuit PCm may include the main thin-film transistor TFT and the main storage capacitor Cst, and the first and second auxiliary pixel circuits PC1 and PC2 may include the auxiliary thin-film transistor TFT' and the auxiliary storage capacitor Cst'.

The main thin-film transistor TFT and the auxiliary thin-film transistor TFT' may be disposed over the buffer layer 111. The main thin-film transistor TFT may include a first semiconductor layer A1, a first gate electrode G1, a first source electrode S1, and a first drain electrode D1. The main thin-film transistor TFT may be connected to a main organic light-emitting diode OLED to drive the main organic light-emitting diode OLED. The auxiliary thin-film transistor TFT' may be connected to the auxiliary organic light-emitting diode OLED' to drive the auxiliary organic light-emitting diode OLED'. Because the auxiliary thin-film transistor TFT' and the main thin-film transistor TFT are similar in configuration, redundant descriptions of the auxiliary thin-film transistor TFT' will not be provided below.

The first semiconductor layer A1 is disposed over the buffer layer 111 and may include polysilicon. In another embodiment, the first semiconductor layer A1 may include amorphous silicon. In another embodiment, the first semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The first semiconductor layer A1 may include a channel area, and a source area and a drain area doped with impurities.

The first gate insulating layer 112 may cover the first semiconductor layer A1. The first gate insulating layer 112 may include an inorganic insulating material, such as $SiO_2$, $SiN_X$, $SiO_XN_Y$, $Al_2O_3$, $TiO_2$, $Ta_2O_5$, $HfO_2$, or ZnO. The first gate insulating layer 112 may be a single layer or a multilayer including the inorganic insulating materials described above.

The first gate electrode G1 may be arranged on the first gate insulating layer 112 to overlap the first semiconductor layer A1. The first gate electrode G1 includes Mo, Al, Cu, Ti, or the like, and may be a single layer or a multilayer. For example, the first gate electrode G1 may be a single Mo layer.

The second gate insulating layer 113 may cover the first gate electrode G1. The second gate insulating layer 113 may include an inorganic insulating material, such as $SiO_2$, $SiN_X$, $SiO_XN_Y$, $Al_2O_3$, $TiO_2$, $Ta_2O_5$, $HfO_2$, or ZnO. The second gate insulating layer 113 may be a single layer or a multilayer including the inorganic insulating materials described above.

An upper electrode CE2 of the main storage capacitor Cst and an auxiliary upper electrode CE2' of the auxiliary storage capacitor Cst' may be arranged on the second gate insulating layer 113.

In the main display area MDA, the upper electrode CE2 of the main storage capacitor Cst may overlap the first gate electrode G1 thereunder. The first gate electrode G1 and the upper electrode CE2 overlapping each other with the second gate insulating layer 113 therebetween may constitute the main storage capacitor Cst. The first gate electrode G1 may be a lower electrode CE1 of the main storage capacitor Cst.

In the circuit area PCA, an auxiliary upper electrode CE2' of the auxiliary storage capacitor Cst' may overlap a gate electrode of the auxiliary thin-film transistor TFT' thereunder. The gate electrode of the auxiliary thin-film transistor TFT' may be a first lower electrode CE1a of the auxiliary storage capacitor Cst'. The auxiliary storage capacitor Cst' may further include a second lower electrode CE1b arranged on a same layer as the first lower electrode CE1a. The auxiliary upper electrode CE2' of the auxiliary storage capacitor Cst' may overlap the first lower electrode CE1a and the second lower electrode CE1b. The first lower electrode CE1a and the second lower electrode CE1b may be electrically connected to each other. By this configuration, a capacitance of the auxiliary storage capacitor Cst' may be greater than that of the main storage capacitor Cst.

Each of the upper electrode CE2 and the auxiliary upper electrode CE2' may include Al, platinum (Pt), palladium (Pd), silver (Ag), magnesium (Mg), gold (Au), nickel (Ni), neodymium (Nd), iridium (Ir), chrome (Cr), calcium (Ca), Mo, Ti, tungsten (W), and/or Cu, and may be a single layer or a multilayer of the materials described above.

The interlayer insulating layer 115 may cover the upper electrode CE2 and the auxiliary upper electrode CE2'. The interlayer insulating layer 115 may include an inorganic insulation material, such as $SiO_2$, $SiN_X$, $SiO_XN_Y$, $Al_2O_3$, $TiO_2$, $Ta_2O_5$, $HfO_2$, or ZnO. The interlayer insulating layer 115 may include a single layer or a multilayer including the inorganic insulating materials described above.

The source electrode S1 and the drain electrode D1 may be arranged on the interlayer insulating layer 115. Each of the source electrode S1 and the drain electrode D1 may include a conductive material, such as Mo, Al, Cu, Ti, or the like, and may be a multilayer or a single layer including the conductive materials described above. For example, each of the source electrode S1 and the drain electrode D1 may have a multilayer structure of a Ti layer, an Al layer, and another Ti layer.

The connection lines TWL2-1 and TWL2-2 connected to the first pixel circuit PC1 may be arranged over the interlayer insulating layer 115. The $(2-1)^{st}$ and $(2-2)^{nd}$ connection lines TWL2-1 and TWL2-2 may extend from the circuit area PCA to the component area CA and connect the auxiliary organic light-emitting diode OLED' and the first pixel circuit PC1 to each other.

The first connection line TWL1 is arranged in the circuit area PCA and may be connected to the second pixel circuit PC2, for example, the auxiliary thin-film transistor TFT'. The first connection line TWL1 may include a conductive material, such as Mo, Al, Cu, Ti, or the like, and may include a multilayer or a single layer including the conductive materials described above.

The $(2-1)^{st}$ connection line TWL2-1 is arranged in the circuit area PCA and may be connected to the first pixel circuit PC1, for example, the auxiliary thin-film transistor TFT'. The $(2-2)^{nd}$ connection line TWL2-2 is connected to the $(2-1)^{st}$ connection line TWL2-1 and may be arranged in the transmission area TA of the component area CA. The $(2-2)^{nd}$ connection line TWL2-2 is arranged on a same layer as the $(2-1)^{st}$ connection line TWL2-1, but may include a different material from the $(2-1)^{st}$ connection line TWL2-1. An end of the $(2-2)^{nd}$ connection line TWL2-2 may cover an end of the $(2-1)^{st}$ connection line TWL2-1.

The $(2-1)^{st}$ connection line TWL2-1 may include a conductive material, such as Mo, Al, Cu, Ti, or the like, and may include a multilayer or a single layer including the conductive materials described above. The $(2-1)^{st}$ connection line TWL2-1 and the first connection line TWL1 may be on a same layer, and may be formed in a same process. The $(2-1)^{st}$ connection line TWL2-1 may include a same material as the first connection line TWL1.

The $(2-2)^{nd}$ connection line TWL2-2 may include a transparent conductive material. For example, the $(2-2)^{nd}$ connection line TWL2-2 may include a transparent conducting oxide (TCO). The $(2-2)^{nd}$ connection line TWL2-2 may include a conducting oxide, such as ITO, IZO, ZnO, $In_2O_3$, IGO, or AZO.

The $(2-1)^{st}$ connection line TWL2-1 may have higher conductivity than the $(2-2)^{nd}$ connection line TWL2-2. Because the $(2-1)^{st}$ connection line TWL2-1 is in the circuit area PCA, a light transmittance may not be ensured, and thus, a material which has lower light transmittance but higher conductivity than the $(2-2)^{nd}$ connection line TWL2-2 may be used. In this way, a resistance value of the connection line TWL may be minimized.

The planarization layer 117 may cover the source electrodes S1 and S2, the drain electrodes D1 and D2, and the connection line TWL. The planarization layer 117 may have a flat upper surface so that a first pixel electrode 121 and a second pixel electrode 121' may be formed flat on the planarization layer 117.

The planarization layer 117 may include an organic material or an inorganic material, and may have a single-layer or multilayer structure. The planarization layer 117 may include a first planarization layer 117a and a second planarization layer 117b. A conductive pattern of lines or the like may be formed between the first planarization layer 117a and the second planarization layer 117b, which is advantageous for high integration. Connection electrodes CM and CM' and a data connection line DWL may be arranged over the first planarization layer 117a.

The planarization layer 117 may include a general-purpose polymer such as benzocyclobutene (BCB), polyimide, hexamethyldisiloxane (HMDSO), poly(methyl methacrylate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, or a vinyl alcohol-based polymer. The planarization layer 117 may include an inorganic insulating material, such as $SiO_X$, $SiN_X$, $SiO_XN_Y$, $Al_2O_3$, $TiO_2$, $Ta_2O_5$, $HfO_2$, or ZnO. After the planarization layer 117 is formed, in order to provide a flat upper surface thereon, chemical mechanical polishing may be performed on an upper surface of the planarization layer 117.

A first planarization layer 117a may cover a pixel circuit. A second planarization layer 117b may be disposed over the first planarization layer 117a, and may have a flat surface so that the first and second pixel electrodes 121 and 121' may be formed flat.

The main and auxiliary light-emitting diodes OLED and OLED' may be arranged on the second planarization layer 117b. The first pixel electrode 121 of the main organic light-emitting diode OLED and the second pixel electrode 121' of the auxiliary organic light-emitting diode OLED' may be connected to a pixel circuit through the connection electrodes CM and CM'.

Each of the first pixel electrode 121 and the second pixel electrode 121' may include a conducting oxide, such as ITO, IZO, ZnO, $In_2O_3$, IGO, or AZO. Each of the first pixel electrode 121 and the second pixel electrode 121' may include a reflective layer including Ag, Mg, Al, Pt, Pd, Au, Ni, Nd, Ir, Cr, or any compounds thereof. For example, the first pixel electrode 121 and the second pixel electrode 121' may have a structure in which layers including ITO, IZO, ZnO, or $In_2O_3$ are disposed over/under the reflective layer described above. In this case, each of the first pixel electrode 121 and the second pixel electrode 121' may have a stacked structure of an ITO layer, an Ag layer, and another ITO layer.

A bank layer 119 covers an edge of the first pixel electrode 121 and the second pixel electrode 121' over the planarization layer 117 and may include a first opening OP1 and a second opening OP2, through which central portions of the first pixel electrode 121 and the second pixel electrode 121' are respectively exposed. Emission areas of the main and auxiliary organic light-emitting diodes OLED and OLED', that is, sizes and shapes of the main and auxiliary sub-pixels Pm and Pa, are defined by a first opening OP1 and a second opening OP2, respectively.

The bank layer 119 may prevent an arc or the like from occurring at the edge of the first and second pixel electrodes 121 and 121' by increasing a distance between the edge of the first and second pixel electrodes 121 and 121' and an opposite electrode 121 at an upper portion of the first and second pixel electrodes 121 and 121'. The bank layer 119 includes an organic insulating material, such as PI, polyamide, an acryl-based resin, BCB, HMDSO, and a phenolic resin, and may be formed by a spin coating method or the like.

A first emission layer 122b and a second emission layer 122b' respectively corresponding to the first pixel electrode 121 and the second pixel electrode 121' may be respectively arranged in the first opening OP1 and the second opening OP2 of the bank layer 119. The first emission layer 122b and the second emission layer 122b' may include a polymer material or a low-molecular weight material and emit red, green, blue, or white light.

An organic functional layer 122e may be disposed over and/or under the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be disposed under the first emission layer 122b and the second emission layer 122b'. The first functional layer 122a may have a single layer or a multilayer including an organic material. The first functional layer 122a may be a hole transport layer (HTL) that is a single layer. In some embodiments, the first functional layer 122a may include a hole injection layer (HIL) and the HTL. The first functional layer 122a may be integrally formed as a single body to correspond to the main and auxiliary organic light-emitting diodes OLED and OLED' respectively included in the main display area MDA and the component area CA.

The second functional layer 122c may be disposed over the first emission layer 122b and the second emission layer 122b'. The second functional layer 122c may be a single layer or a multilayer including an organic material. The second functional layer 122c may include an electron transport layer (ETL) and/or an electron injection layer (EIL). The second functional layer 122c may be integrally formed as a single body to correspond to the main and auxiliary organic light-emitting diodes OLED and OLED' respectively included in the main display area MDA and the component area CA.

An opposite electrode 123 is arranged over the second functional layer 122c. The opposite electrode 123 may include a conductive material having a low work function. For example, the opposite electrode 123 may include a (semi) transparent layer including Ag, Mg, Al, Pt, Pd, Au, Ni, Nd, Ir, Cr, Li, Ca, or any alloys thereof. In some embodiments, the opposite electrode 123 may further include a layer such as an ITO layer, an IZO layer, a ZnO layer, or $In_2O_3$ layer, on the (semi) transparent layer including the materials described above. The opposite electrode 123 may be integrally formed as a single body to correspond to the main and auxiliary organic light-emitting diodes OLED and OLED' respectively included in the main display area MDA and an auxiliary display area SDA.

Layers from the first pixel electrode 121 to the opposite electrode 123 in the main display area MDA in the main display area MDA may constitute the main organic light-emitting diode OLED. Layers from the second pixel electrode 121' to the opposite electrode 123 in the component area CA and the circuit area PCA may constitute the auxiliary organic light-emitting diode OLED'.

An upper layer 150 may be formed on the opposite electrode 123, the upper layer 150 including an organic material. The upper layer 150 may protect the opposite electrode 123 and increase light extraction efficiency. The upper layer 150 may include an organic material having a higher refractive index than the opposite electrode 123. In some embodiments, layers having different refractive indices may be stacked in the upper layer 150. For example, the upper layer 150 may have a stacked structure of a high-refractive index layer, a low-refractive index layer, and another high-refractive index layer. In this case, the high-refractive index layer may have a refractive index of 1.7 or greater, and the low-refractive index layer may have a refractive index of 1.3 or less.

The upper layer 150 may additionally include a lithium fluoride (LiF). In some embodiments, the upper layer 150 may further include an inorganic insulating material, such as $SiO_2$ and silicon nitride $SiN_x$.

Figure 8B:
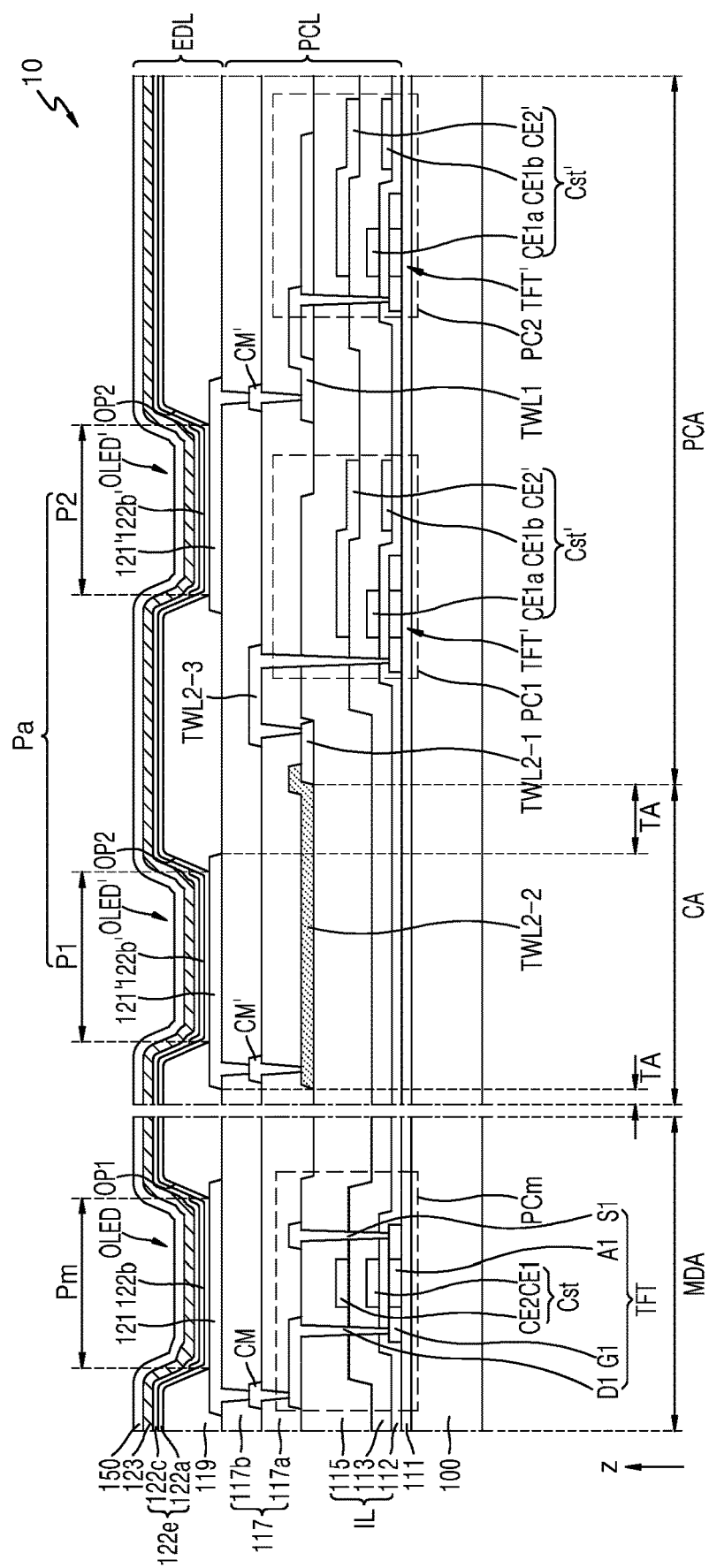
FIG. 8B is a cross-sectional view of a portion of a display panel according to an embodiment.

FIG. 8B is a cross-sectional view illustrating a portion of a display panel 10 according to an embodiment. In FIG. 8B, the same reference signs as those of FIG. 8A denote the same elements, and redundant descriptions thereof will be omitted.

Referring to FIG. 8B, a $(2-3)^{rd}$ connection line TWL2-3 may be arranged on a different layer from the $(2-1)^{st}$ connection line TWL2-1 and the $(2-2)^{nd}$ connection line TWL2-2. For example, the $(2-1)^{st}$ connection line TWL2-1 may be arranged on the interlayer insulating layer 115, and the $(2-3)^{rd}$ connection line TWL2-3 may be arranged on the first planarization layer 117*a*.

The $(2-1)^{st}$ connection line TWL2-1 and the $(2-3)^{rd}$ connection line TWL2-3 may be connected to each other through a contact hole that penetrates through the first planarization layer 117*a* around a border between the component area CA and the circuit area PCA. The $(2-3)^{rd}$ connection line TWL2-3 may include a material having high conductivity.

As shown in FIGS. 8A and 8B, the $(2-2)^{nd}$ connection line TWL2-2 may be on the first planarization layer 117*a* that is disposed over the interlayer insulating layer 115 and under the second planarization layer 117*b*. As described above, when the $(2-2)^{nd}$ connection line TWL2-2 is arranged on one layer, an additional process for forming the $(2-2)^{nd}$ connection line TWL2-2 may be minimized. In other words, no more than one process operation for forming the $(2-2)^{nd}$ connection line TWL2-2 may be added.

Figure 8C:
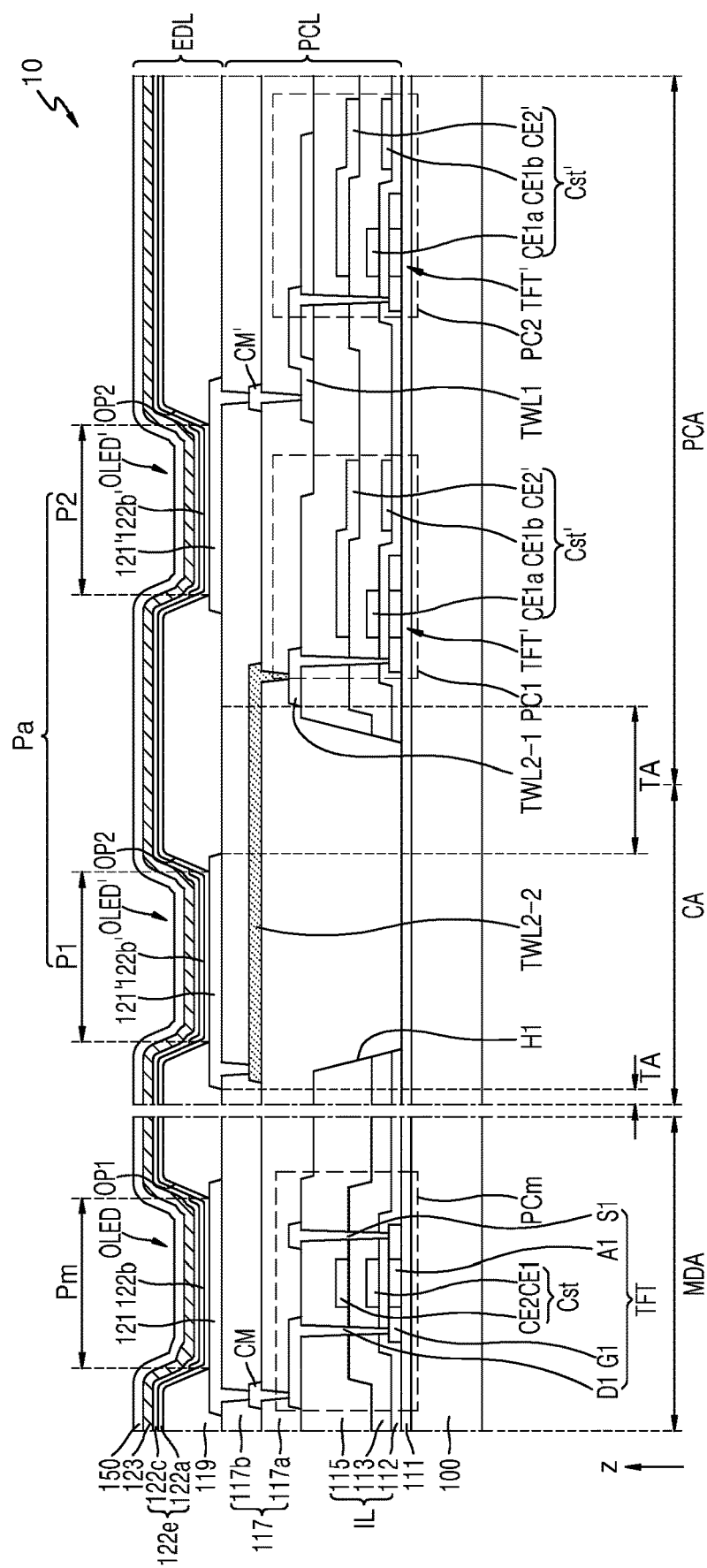
FIG. 8C is a cross-sectional view of a portion of a display panel according to an embodiment.

FIG. 8C is a schematic cross-sectional view illustrating a portion of a display panel 10 according to an embodiment. In FIG. 8C, the same reference signs as those of FIG. 8A denote the same elements, and redundant descriptions thereof will be omitted.

An inorganic insulating layer IL of the display panel 10 may include a hole or a groove corresponding to the component area CA. For example, when the first gate insulating layer 112, the second gate insulating layer 113, and the interlayer insulating layer 115 are collectively referred to as the inorganic insulating layer IL, the inorganic insulating layer IL may have a first hole H1 corresponding to the transmission area TA. Through the first hole H1, the buffer layer 111 or a portion of an upper surface of the substrate 100 may be exposed. The first hole H1 may be generated by overlapping an opening in the first gate insulating layer 112, an opening in the second gate insulating layer 113, and an opening in the interlayer insulating layer 115, which are formed to correspond to the component area CA. The openings may be individually formed through a separate process or may be simultaneously formed through a same process. When the openings are formed through a separate process, an inner side of the first hole H1 may not be smooth and may have a staircase-shaped step. Unlike this, the inorganic insulating layer IL may have a groove instead of the first hole H1, through which the buffer layer 111 is exposed. An organic insulating material may be filled in a hole or a groove in the inorganic insulating layer IL. The organic insulating material may be a same material as that of the first planarization layer 117*a*.

As the inorganic insulating layer IL has a hole or a groove corresponding to the component area CA, a light transmittance of the component area CA may increase. For example, the hole or the groove corresponding to the component area CA may be filled with an organic insulating material, and the organic insulating material may have a greater light transmittance than a material of the inorganic insulating layer IL. Thus, the light transmittance of the component area CA may increase.

Unlike in FIG. 8A, the $(2-2)^{nd}$ connection line TWL2-2 may be arranged on the first planarization layer 117*a*.

Figure 9A:
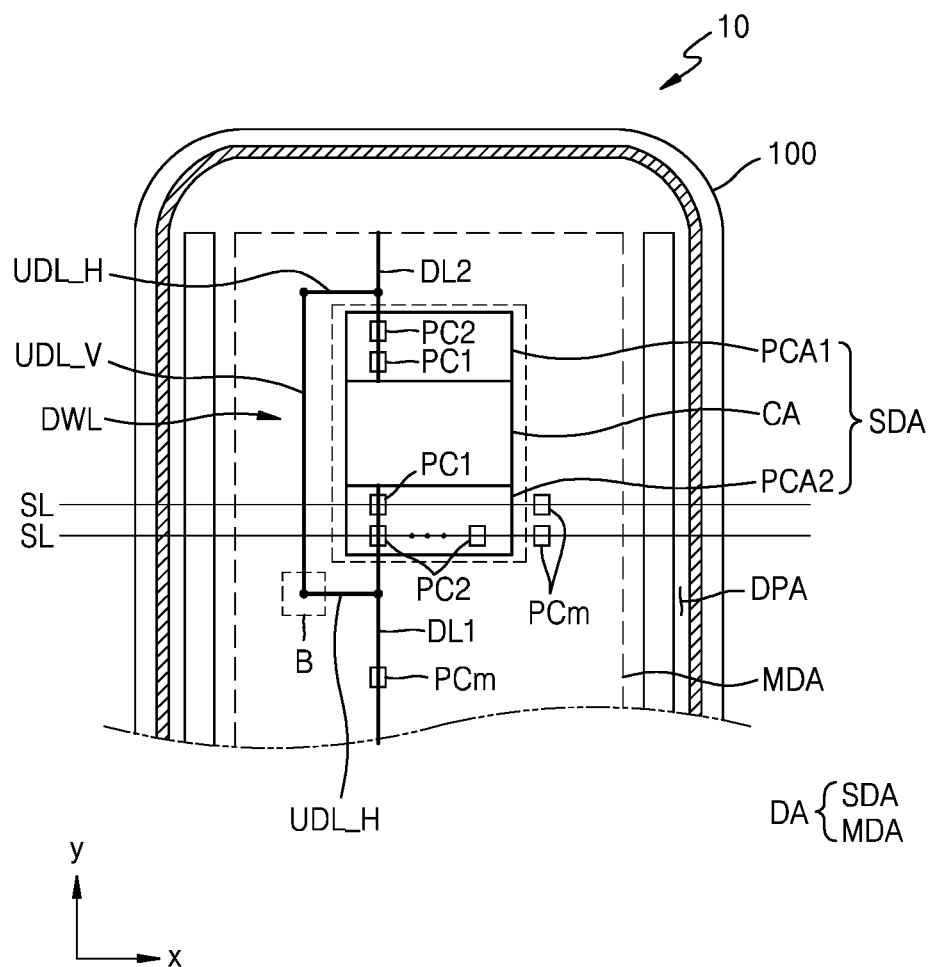
FIGS. 9A and 9B are schematic plan views of a portion of a display panel according to an embodiment.
Figure 9B:
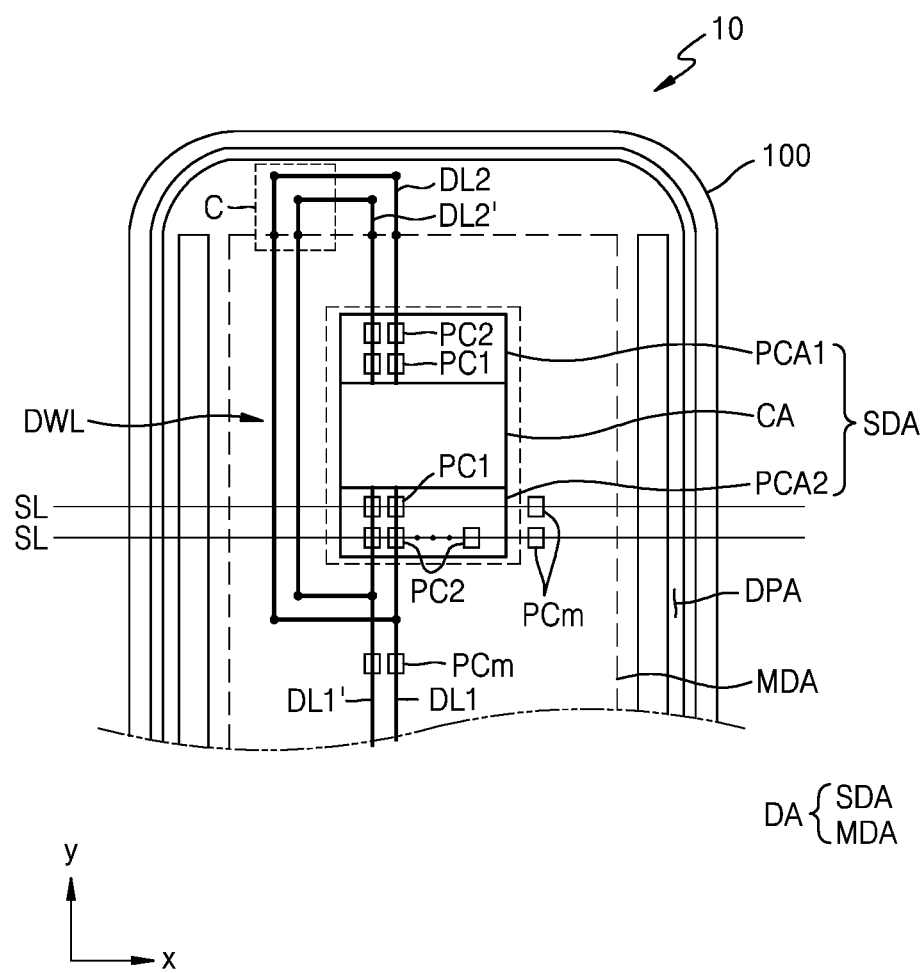

FIGS. 9A and 9B are schematic plan views illustrating a portion of a display panel 10 according to an embodiment.

Referring to FIGS. 9A and 9B, the display panel 10 may include a data line DL for transmitting a data signal to main and auxiliary pixel circuits PCm and PCa, and a scan line SL for transmitting a scan signal to the main and auxiliary pixel circuits PCm and PCa.

The scan line SL may extend in the x direction. The main pixel circuit PCm and a first pixel circuit PC1 that are arranged in a same row, may be connected to a same scan line SL to receive a scan signal. The main pixel circuit PCm and the second pixel circuit PC2 that are arranged in a same row may be connected to a same scan line SL and receive a scan signal.

The data line DL may extend in the y direction. Some data lines may be a first data line DL1 and a second data line DL2, which are spaced apart from each other with respect to an auxiliary display area SDA. The first data line DL1 and the second data line DL2 may be electrically connected to each other by using a data connection line DWL. The data connection line DWL may include a horizontal connection line UDL_H and a vertical connection line ULD_V, which are arranged on different layers from each other so as not to interfere with each other. A first pixel circuit PC1, a second pixel circuit PC2, and a main pixel circuit PCm, which are arranged in a same column, may be connected to the same first data line DL1, second data line DL2, and data connection line DWL and receive a same data signal. The first data line DL1, the second data line DL2, and the data connection line DWL may be arranged in the display area DA.

According to another embodiment, as shown in FIG. 9B, the data connection line DWL and a portion of the second data lines DL2 and DL2' may be arranged in the peripheral area DPA.

Figure 10A:
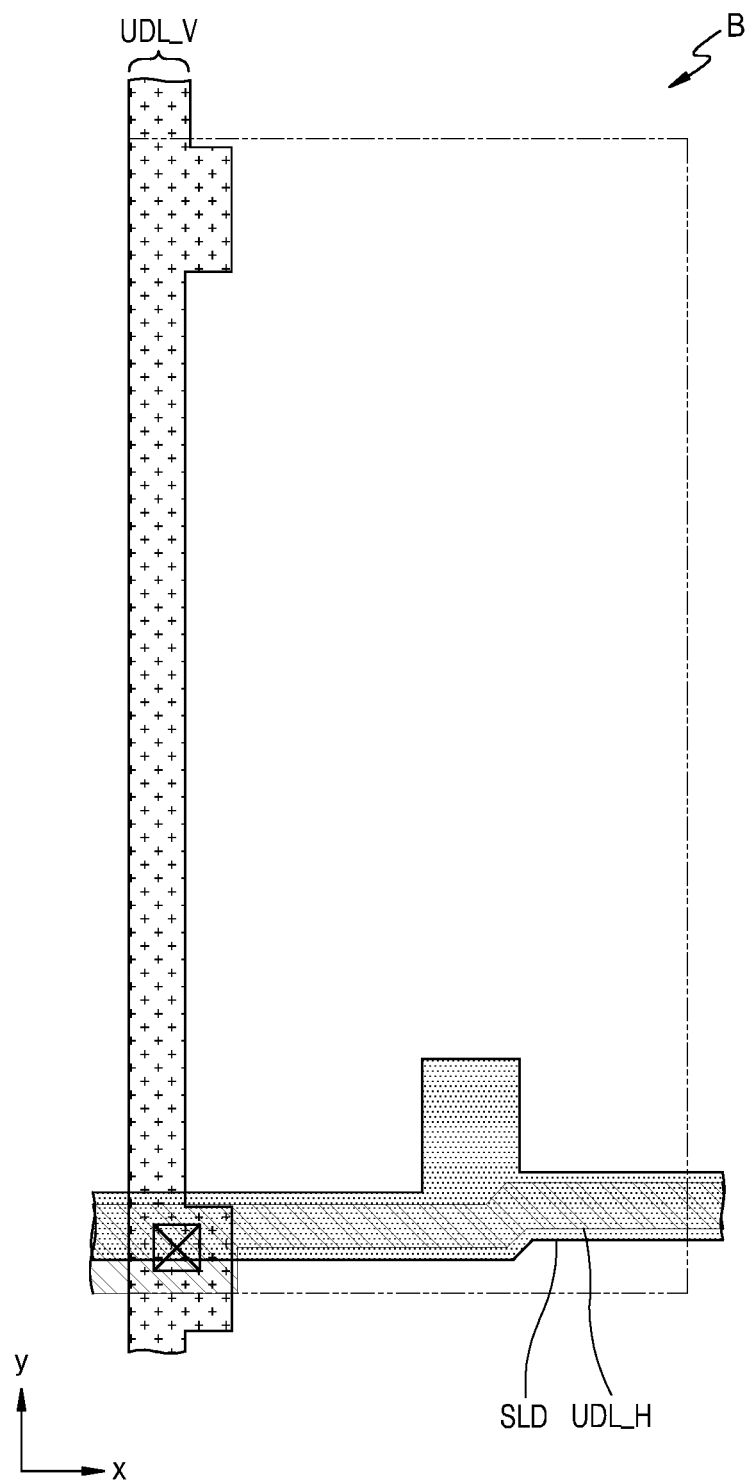
FIG. 10A is an enlarged plan view of a region of FIG. 9A.

FIG. 10A is a plan view of an enlarged region B of FIG. 9A.

The data connection line DWL may include the horizontal connection line UDL_H extending in the x direction, and the vertical connection line ULD_V extending in the y direction. The horizontal connection line UDL_H and the vertical connection line ULD_V may be arranged on different layers from each other so as not to interfere with each other. The horizontal connection line UDL_H may overlap the shielding line SLD so that the horizontal connection line UDL_H may be stably driven. The horizontal connection line UDL_H is disposed over a same layer as the interlayer insulating layer 115 (see FIG. 8A), and the two layers may include a same material. The horizontal connection line UDL_H may be connected to the vertical connection line ULD_V through a contact hole to transmit a data signal in the y direction. The vertical connection line ULD_V and a connection electrode CM (see FIG. 8A) may be arranged on a same layer, and include a same material.

Figure 10B:
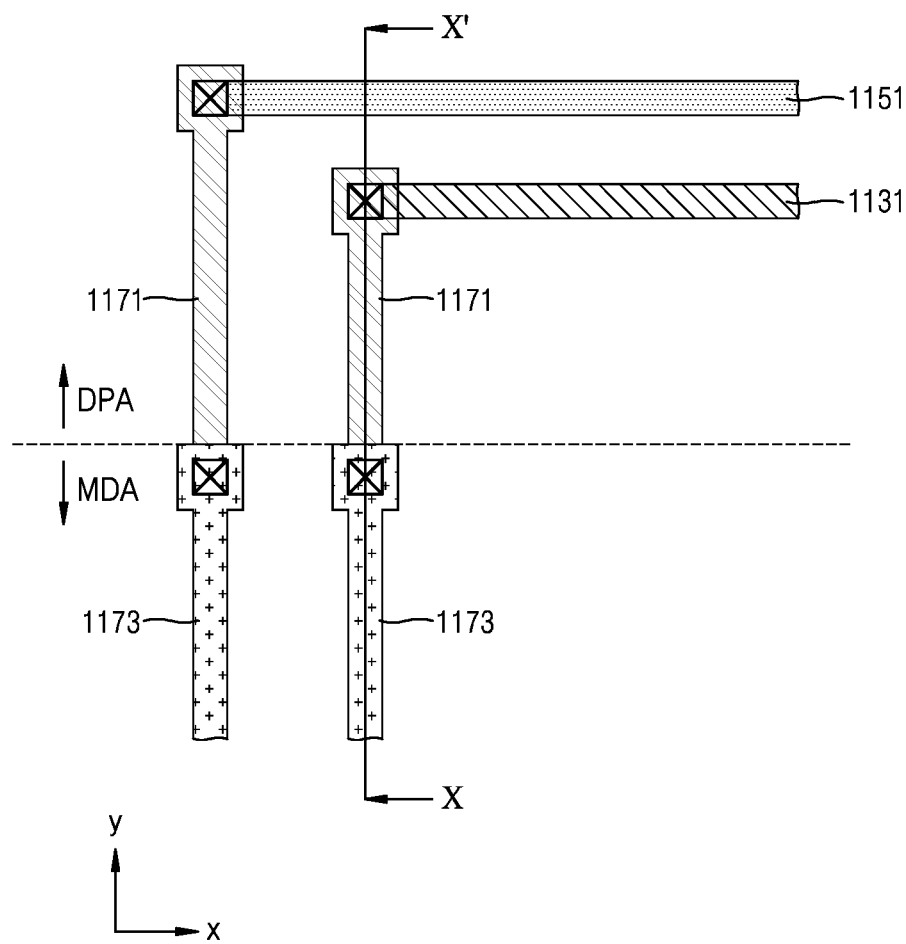
FIG. 10B is an enlarged plan view of a region of FIG. 9B.
Figure 10C:
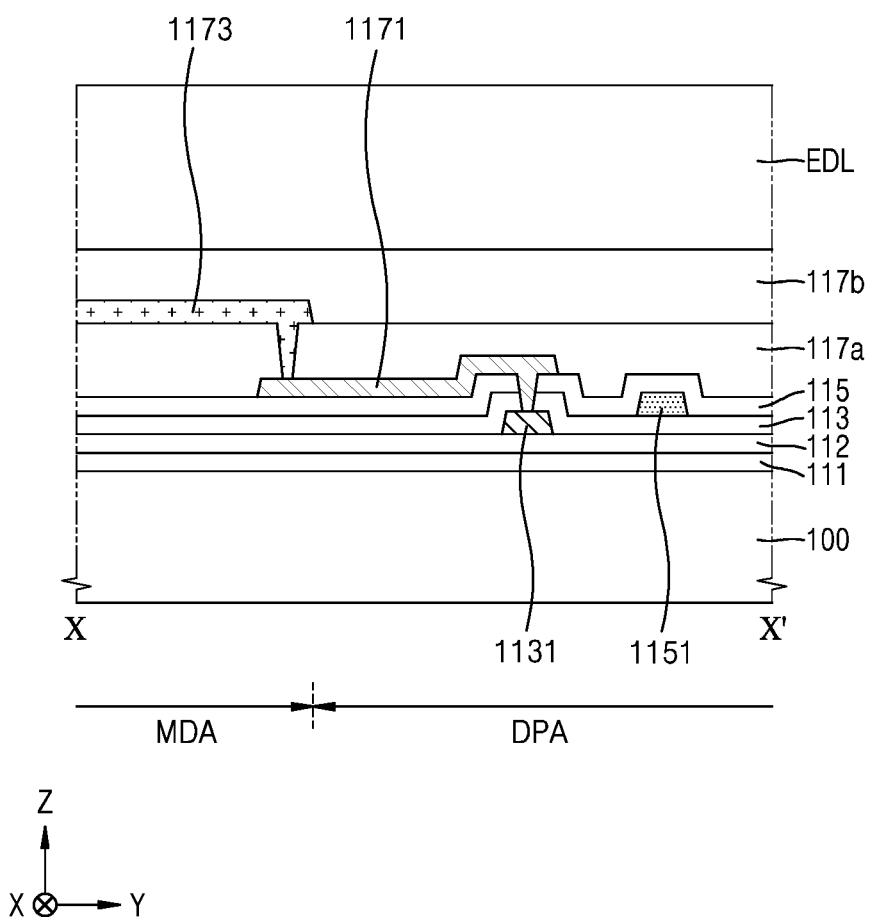
FIG. 10C is a cross-sectional view of a portion of FIG. 10B, taken along line X-X'.

FIG. 10B is a plan view of an enlarged region C of FIG. 9B. FIG. 10C is a cross-sectional view of a portion of FIG. 10B, taken along line X-X'.

In FIGS. 10B and 10C, the same reference signs as those of FIG. 8A denote the same elements, and redundant descriptions thereof will be omitted.

Referring to FIGS. 10B and 10C, a first horizontal line 1131 may be arranged on the first gate insulating layer 112, and a second horizontal line 1151 may be arranged on the second gate insulating layer 113. The first horizontal line 1131 and the second horizontal line 1151 may be a portion of a data connection line. The first horizontal line 1131 may be arranged on the first gate insulating layer 112. In addition, the first horizontal line 1131 may be arranged on a same layer as the lower electrode CE1, or a gate electrode, of the storage capacitor, and may include a same material. The second horizontal line 1151 may be arranged on the second gate insulating layer 113. In addition, the second horizontal line 1151 may be arranged on a same layer as the upper electrode CE2 of the storage capacitor, and may include a same material. The second horizontal line 1151 may be connected to a first connection line 1171 through a contact hole. The first connection line 1171 may be arranged on the interlayer insulating layer 115. In addition, the first connection line 1171 may be arranged on a same layer as the horizontal connection line UDL_H (see FIG. 10A), and may include a same material. The first horizontal line 1131 may be connected to the first connection line 1171 through a contact hole. When the first connection line 1171 extends in the y-axis direction and reaches the main display area MDA, the first connection line 1171 may be reconnected to a second connection line 1173 through the contact hole. The second connection line 1173 may include a same material as the vertical connection line ULD_V (see FIG. 10A).

As described above, in a display panel and a display apparatus according to an embodiment, a circuit area adjacent to a component area is arranged in a display area, and thus, an area for operating a component may be ensured, and the component area may be positioned anywhere in the panel. Thus, an area of a peripheral area may not increase by the circuit for driving the component.

In addition, a sufficient resolution of the component area may be ensured while minimizing a formation process of a transparent connection line. However, the scope of the embodiments described herein are not limited by this effect.

It should be understood that embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the scope as defined by the following claims.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
    a substrate comprising a main display area, an auxiliary display area, and a peripheral area, the auxiliary display area comprising a circuit area and a component area;
    main display elements arranged in the main display area and main pixel circuits respectively connected to the main display elements;
    first display elements arranged in the component area;
    second display elements arranged in the circuit area; and
    auxiliary pixel circuits arranged in the circuit area,
    wherein the circuit area is arranged between the main display area and the component area,
    the auxiliary pixel circuits comprise:
        first pixel circuits connected to the first display elements, respectively; and
        second pixel circuits connected to the second display elements, respectively, and
        at least some of the second display elements overlap the first pixel circuits.

2. The display panel of claim 1, further comprising a pad unit arranged in the peripheral area,
    wherein the circuit area comprises a first circuit area and a second circuit area which are spaced apart from each other with the component area therebetween, and
    the first circuit area is arranged farther from the pad unit than the component area, and the second circuit area is arranged closer to the pad unit than the component area.

3. The display panel of claim 1, wherein an area occupied by one of the auxiliary pixel circuits is greater than an area occupied by one of the main pixel circuits.

4. The display panel of claim 1, wherein each of the main pixel circuits comprises a semiconductor layer comprising a first channel area, and a first transistor having a first gate electrode,
    each of the auxiliary pixel circuit comprises a semiconductor layer comprising a second channel area, and a second transistor having a second gate electrode,
    the first transistor and the second transistor include driving thin-film transistors, and
    a width of the second channel area is greater than a width of the first channel area.

5. The display panel of claim 4, wherein a length of the second channel area is less than a length of the first channel area.

6. The display panel of claim 4, wherein each of the main pixel circuits comprises a main capacitor overlapping the first transistor,
    each of the auxiliary pixel circuits comprises an auxiliary capacitor overlapping the second transistor, and
    a capacitance of the auxiliary capacitor is greater than a capacitance of the main capacitor.

7. The display panel of claim 1, wherein the second pixel circuits are arranged between the main pixel circuits and the first pixel circuits.

8. The display panel of claim 1, wherein a number of first pixel circuits is greater than a number of second pixel circuits.

9. The display panel of claim 2, further comprising a first data line and a second data line which are spaced apart from each other with the auxiliary display area therebetween,
    wherein the first data line and the second data line are connected to each other using a data connection line.

10. The display panel of claim 9, wherein the data connection line detours around the auxiliary display area and is arranged in the main display area.

11. The display panel of claim 9, wherein at least a portion of the data connection line is arranged in the peripheral area.

12. The display panel of claim 9, further comprising a shielding line overlapping the data connection line.

13. The display panel of claim 1, wherein a number of first display elements per unit area and a number of second display elements per unit area is less than a number of main display elements per unit area.

14. A display apparatus comprising:
a display panel comprising a main display area, an auxiliary display area, and a peripheral area, the auxiliary display area having a circuit area and a component area therein; and
a component arranged to correspond to the component area at a lower portion of the display panel,
wherein the display panel comprises:
a substrate;
main display elements arranged in the main display area and main pixel circuits connected to the main display elements;
auxiliary display elements comprising first display elements arranged in the component area and second display elements arranged in the circuit area, and auxiliary pixel circuits connected to the auxiliary display elements,
the auxiliary pixel circuits comprise:
first pixel circuits connected to the first display elements, respectively; and
second pixel circuits connected to the second display elements, respectively,
the circuit area is arranged between the main display area and the component area, and
at least some of the second display elements overlap the first pixel circuits.

15. The display apparatus of claim 14, further comprising a pad unit in the peripheral area,
wherein the circuit area comprises a first circuit area and a second circuit area which are spaced apart from each other with the component area therebetween, and
the first circuit area is arranged farther from the pad unit than the component area, and the second circuit area is arranged closer to the pad unit than the component area.

16. The display apparatus of claim 14, wherein each of the main pixel circuits comprises a semiconductor layer comprising a first channel area, and a first transistor having a first gate electrode,
each of the auxiliary pixel circuits comprises a semiconductor layer comprising a second channel area, and a second transistor having a second gate electrode,
the first transistor and the second transistor include driving thin-film transistors, and
a width of the second channel area is greater than a width of the first channel area.

17. The display apparatus of claim 16, wherein a length of the second channel area is less than a length of the first channel area.

18. The display apparatus of claim 16, wherein each of the main pixel circuits comprises a main capacitor overlapping the first transistor,
each of the auxiliary pixel circuits comprises an auxiliary capacitor overlapping the second transistor, and
a capacitance of the auxiliary capacitor is greater than a capacitance of the main capacitor.

19. The display apparatus of claim 14, further comprising:
a first data line and a second data line which are spaced apart from each other with the auxiliary display area therebetween;
a data connection line connecting the first data line and the second data line; and
a shielding line overlapping the data connection line.

20. The display apparatus of claim 14, wherein a number of first display elements per unit area and a number of second display elements per unit area is less than a number of main display elements per unit area.

* * * * *